United States Patent
Islam et al.

(10) Patent No.: US 11,139,027 B1
(45) Date of Patent: Oct. 5, 2021

(54) APPARATUS, SYSTEM AND METHOD TO REDUCE A READ VOLTAGE ACROSS A MEMORY CELL AND IMPROVE READ SENSE MARGIN

(71) Applicant: Intel Corporation, Santa Clara, CA (US)

(72) Inventors: Ashraf B. Islam, El Dorado Hills, CA (US); Kevin E. Arendt, Orangevale, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/946,530

(22) Filed: Jun. 25, 2020

(51) Int. Cl.
*G11C 7/02* (2006.01)
*G11C 13/00* (2006.01)

(52) U.S. Cl.
CPC ........ *G11C 13/004* (2013.01); *G11C 13/0004* (2013.01); *G11C 2013/0045* (2013.01)

(58) Field of Classification Search
CPC .............. G11C 13/004; G11C 13/0004; G11C 13/0045
USPC .......................................................... 365/207
See application file for complete search history.

(56) References Cited

U.S. PATENT DOCUMENTS

| 2011/0199812 A1* | 8/2011 | Kitagawa | G11C 13/0007 365/148 |
| 2012/0212994 A1* | 8/2012 | Tsushima | G11C 13/0069 365/148 |
| 2014/0003124 A1* | 1/2014 | Youn | G11C 13/0002 365/148 |

* cited by examiner

*Primary Examiner* — Vu A Le
(74) *Attorney, Agent, or Firm* — Alliance IP, LLC

(57) ABSTRACT

A method, apparatus and system. The method includes: generating, during a read operation of a memory cell, a mirror current iMir1 at one of a WL node or a BL node of the memory cell opposite, respectively, one of a BL side or a WL side of the memory cell to which a current mode sense circuitry is connected, the iMir1 to reduce a value of the read voltage from VDM1 to VDM2, wherein the read voltage is between the WL node and the BL node; and sensing, using the current mode sense circuitry, a logic state of the memory cell at VDM2.

20 Claims, 10 Drawing Sheets

APPARATUS, SYSTEM AND METHOD TO REDUCE A READ VOLTAGE ACROSS A MEMORY CELL AND IMPROVE READ SENSE MARGIN

FIELD

The present disclosure relates in general to the field of computer development, and more specifically, to read voltage regulation across a memory cell of a memory array.

BACKGROUND

A storage device may include non-volatile memory, such as multi-stack three dimensional (3D) crosspoint memory cells or arrays.

Ideally, when a read voltage (VDM) is applied between the bitline and the wordline of a target memory cell, VDM would provide the necessary voltage to read a logic state one or a logic state zero depending on whether the target cell is a set cell (in a crystalline state) or a reset cell (in an amorphous state). During read operations, the ideal VDM applied may sometimes ramp up to an unintended VDM level, which may be high enough to snap or threshold some of the reset cells of an array, that is, to change the state of the reset cell from a reset cell to a set cell, because the unintended VDM may be higher than a minimum threshold voltage of the distribution of reset cells.

Mechanisms are needed to obviate or mitigate the effects of an unintended VDM in a read operation.

BRIEF DESCRIPTION OF THE DRAWINGS

Like reference numbers and designations in the various drawings indicate like elements.

DETAILED DESCRIPTION

Although the drawings depict particular computer systems, the concepts of various embodiments are applicable to any suitable computer systems. Examples of systems in which teachings of the present disclosure may be used include desktop computer systems, server computer systems, storage systems, handheld devices, tablets, other thin notebooks, system on a chip (SOC) devices, and embedded applications. Some examples of handheld devices include cellular phones, digital cameras, media players, personal digital assistants (PDAs), and handheld PCs. Embedded applications may include microcontrollers, digital signal processors (DSPs), SOCs, network computers (NetPCs), set-top boxes, network hubs, wide area networks (WANs) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising one or more computing devices.

Figure 1:
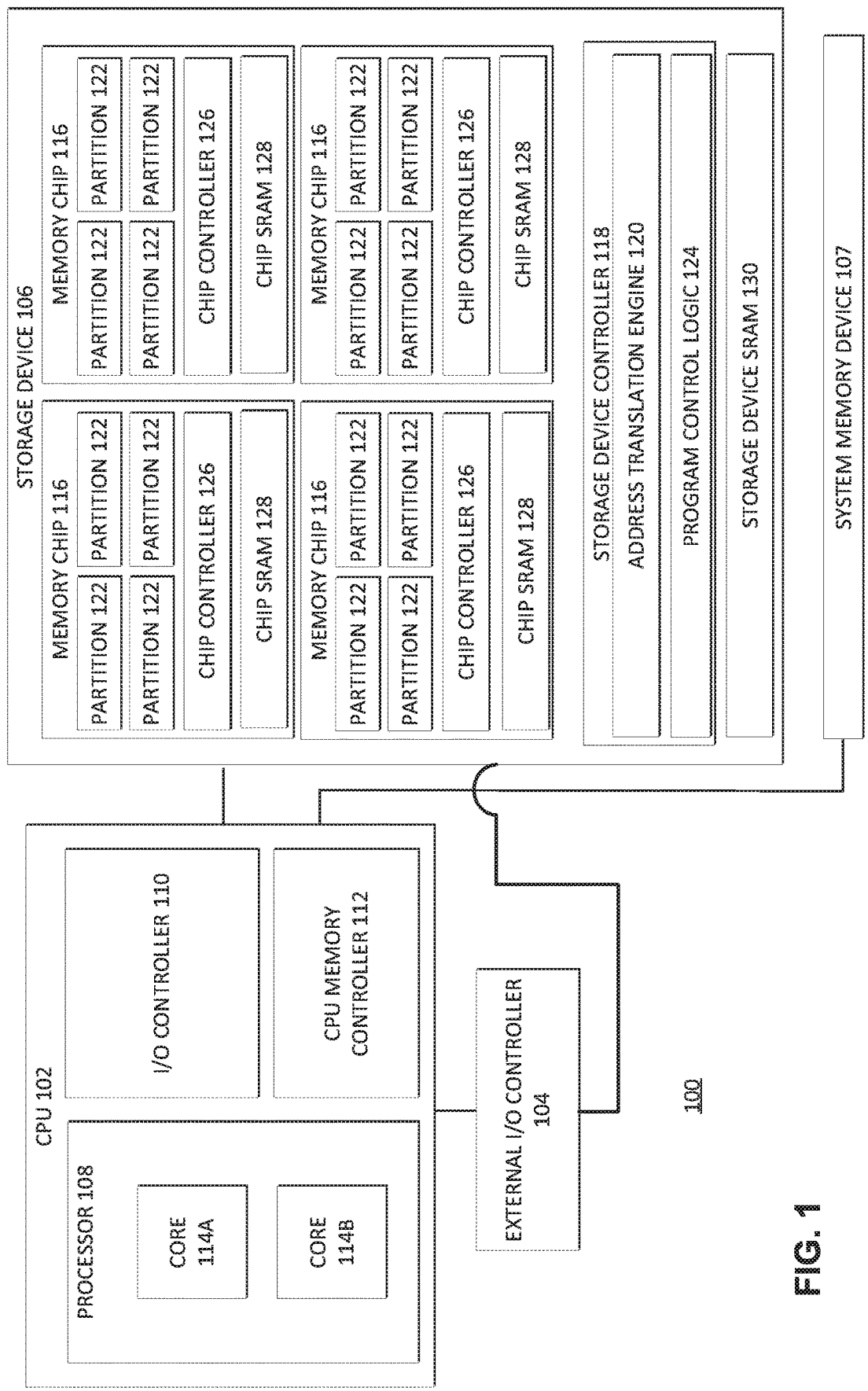
FIG. 1 is a schematic illustration of a block diagram of components of a computer system according to some embodiments.

FIG. 1 illustrates a block diagram of components of a computer system 100 in accordance with some embodiments. System 100 includes a central processing unit (CPU) 102 coupled to an external input/output (I/O) controller 104, a storage device 106 such as a solid state drive (SSD), and system memory device 107. During operation, data may be transferred between a storage device 106 and/or system memory device 107 and the CPU 102. In various embodiments, particular memory access operations (e.g., read and write operations) involving a storage device 106 or system memory device 107 may be issued by an operating system and/or other software applications executed by processor 108. In various embodiments, a storage device 106 may include a storage device controller 118 and one or more memory chips 116 that each comprise any suitable number of memory partitions 122.

In various embodiments, a memory partition may include a 3D crosspoint memory array. In some embodiments, a 3D crosspoint memory array may comprise a transistor-less (i.e., at least with respect to the data storage elements of the memory) stackable crosspoint architecture in which memory cells sit at the intersection of row address lines and column address lines arranged in a grid.

During a read operation, a differential bias sometimes referred to as a demarcation voltage (VDM) may be applied across the terminals of the memory cell and the state of the memory cell may be sensed based on the reaction of the memory cell to the applied bias. For example, the memory cell may either go into a conductive ON state (logic one) or remain in a weakly conductive OFF state (logic zero). The applied voltage at which a memory cell transitions from being sensed as a logic one to being sensed as a logic zero may be termed a threshold voltage of the memory cell. Thus, as an example, when the VDM is higher than the threshold voltage of the memory cell, the memory cell may be sensed as storing a logic one and when the VDM is lower than the threshold voltage of the memory cell, the memory cell may be sensed as storing a logic zero.

CPU 102 comprises a processor 108, such as a microprocessor, an embedded processor, a DSP, a network processor, a handheld processor, an application processor, a co-processor, an SOC, or other device to execute code (i.e., software instructions). Processor 108, in the depicted embodiment, includes two processing elements (cores 114A and 114B in the depicted embodiment), which may include asymmetric processing elements or symmetric processing elements. However, a processor may include any number of processing elements that may be symmetric or asymmetric. CPU 102 may be referred to herein as a host computing device (though a host computing device may be any suitable computing device operable to issue memory access commands to a storage device 106).

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 114 (e.g., 114A or 114B) may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices, which may refer to any suitable logic capable of transferring data to and/or receiving data from an electronic system, such as CPU 102. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input device such as a monitor, printer, mouse, keyboard, or scanner; or other suitable device. In a particular embodiment, an I/O device may comprise storage device controller 118 of storage device 106 coupled to the CPU 102 through I/O controller 110.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and the underlying I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller may be located off-chip (i.e., not on the same chip as CPU 102) or may be integrated on the same chip as the CPU 102.

CPU memory controller 112 is an integrated memory controller that includes logic to control the flow of data going to and from one or more system memory devices 107. CPU memory controller 112 may include logic operable to read from a system memory device 107, write to a system memory device 107, or to request other operations from a system memory device 107. In various embodiments, CPU memory controller 112 may receive write requests from cores 114 and/or I/O controller 110 and may provide data specified in these requests to a system memory device 107 for storage therein. CPU memory controller 112 may also read data from a system memory device 107 and provide the read data to I/O controller 110 or a core 114. During operation, CPU memory controller 112 may issue commands including one or more addresses of the system memory device 107 in order to read data from or write data to memory (or to perform other operations). In some embodiments, CPU memory controller 112 may be implemented on the same chip as CPU 102, whereas in other embodiments, CPU memory controller 112 may be implemented on a different chip than that of CPU 102. I/O controller 110 may perform similar operations with respect to one or more storage devices 106.

The CPU 102 may also be coupled to one or more other I/O devices through external I/O controller 104. In a particular embodiment, external I/O controller 104 may couple a storage device 106 to the CPU 102. External I/O controller 104 may include logic to manage the flow of data between one or more CPUs 102 and I/O devices. In particular embodiments, external I/O controller 104 is located on a motherboard along with the CPU 102. The external I/O controller 104 may exchange information with components of CPU 102 using point-to-point or other interfaces.

A system memory device 107 may store any suitable data, such as data used by processor 108 to provide the functionality of computer system 100. For example, data associated with programs that are executed or files accessed by cores 114 may be stored in system memory device 107. Thus, a system memory device 107 may include a system memory that stores data and/or sequences of instructions that are executed or otherwise used by the cores 114. In various embodiments, a system memory device 107 may store persistent data (e.g., a user's files or instruction sequences) that maintains its state even after power to the system memory device 107 is removed. A system memory device 107 may be dedicated to a particular CPU 102 or shared with other devices (e.g., one or more other processors or other devices) of computer system 100.

In various embodiments, a system memory device 107 may include a memory comprising any number of memory partitions, a memory device controller, and other supporting logic (not shown). A memory module may include nonvolatile memory and/or volatile memory.

Non-volatile memory is a storage medium that does not require power to maintain the state of data stored by the medium. In various embodiments, non-volatile memory may be byte or block addressable. Nonlimiting examples of nonvolatile memory may include any or a combination of: solid state memory (such as planar or 3-dimensional (3D) NAND flash memory or NOR flash memory), 3D crosspoint memory, phase change memory or SXP memory (e.g., memory that uses a chalcogenide glass phase change material in the memory cells), ferroelectric memory, silicon-oxide-nitride-oxide-silicon (SONOS) memory, polymer memory (e.g., ferroelectric polymer memory), ferroelectric transistor random access memory (Fe-TRAM) ovonic memory, anti-ferroelectric memory, nanowire memory, electrically erasable programmable read-only memory (EEPROM), a memristor, single or multi-level phase change memory (PCM), Spin Hall Effect Magnetic RAM (SHE-MRAM), and Spin Transfer Torque Magnetic RAM (STTRAM), a resistive memory, magnetoresistive random access memory (MRAM) memory that incorporates memristor technology, resistive memory including the metal oxide base, the oxygen vacancy base and the conductive bridge Random Access Memory (CB-RAM), a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory.

Volatile memory is a storage medium that requires power to maintain the state of data stored by the medium. Nonlimiting examples of volatile memory may include various types of random access memory (RAM), such as dynamic random access memory (DRAM) or static random access memory (SRAM). One particular type of DRAM that may be used in a memory module is synchronous dynamic random access memory (SDRAM). In some embodiments, any portion of memory 107 that is volatile memory can comply with JEDEC standards including but not limited to Double Data Rate (DDR) standards, e.g., DDR3, 4, and 5, or Low Power DDR4 (LPDDR4) as well as emerging standards.

A storage device 106 may store any suitable data, such as data used by processor 108 to provide functionality of computer system 100. For example, data associated with programs that are executed or files accessed by cores 114A and 114B may be stored in storage device 106. In various embodiments, a storage device 106 may store persistent data (e.g., a user's files or software application code) that maintains its state even after power to the storage device 106 is removed. A storage device 106 may be dedicated to CPU 102 or shared with other devices (e.g., another CPU or other device) of computer system 100.

In the embodiment depicted, storage device 106 includes a storage device controller 118 and four memory chips 116 each comprising four memory partitions 122 operable to store data, however, a storage device may include any suitable number of memory chips each having any suitable number of memory partitions. A memory partition 122 includes a plurality of memory cells operable to store data. The cells of a memory partition 122 may be arranged in any suitable fashion, such as in rows (e.g., wordlines) and columns (e.g., bitlines), three dimensional structures, sectors, or in other ways. In various embodiments, the cells may be logically grouped into banks, blocks, subblocks, wordlines, pages, frames, bytes, slices, or other suitable groups.

In various embodiments, a memory partition 122 may include any of the volatile or non-volatile memories listed above or other suitable memory. In a particular embodiment, each memory partition 122 comprises one or more 3D crosspoint memory arrays. 3D crosspoint arrays are described in more detail in connection with the following figures.

In various embodiments, storage device 106 may comprise a solid state drive; a memory card; a Universal Serial Bus (USB) drive; a Non-Volatile Dual In-line Memory Module (NVDIMM); storage integrated within a device such as a smartphone, camera, or media player; or other suitable mass storage device.

In a particular embodiment, one or more memory chips 116 are embodied in a semiconductor package. In various embodiments, a semiconductor package may comprise a casing comprising one or more semiconductor chips (also referred to as dies). A package may also comprise contact pins or leads used to connect to external circuits. In various embodiments, a memory chip may include one or more memory partitions 122.

Accordingly, in some embodiments, storage device 106 may comprise a package that includes a plurality of chips that each include one or more memory partitions 122. However, a storage device 106 may include any suitable arrangement of one or more memory partitions and associated logic in any suitable physical arrangement. For example, memory partitions 122 may be embodied in one or more different physical mediums, such as a circuit board, semiconductor package, semiconductor chip, disk drive, other medium, or any combination thereof.

Storage device 106 may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. A storage device 106 may also include a communication interface to communicate with CPU memory controller 112 or I/O controller 110 in accordance with any suitable logical device interface specification such as NVMe, AHCI, or other suitable specification. In particular embodiments, storage device 106 may comprise multiple communication interfaces that each communicate using a separate protocol with CPU memory controller 112 and/or I/O controller 110.

Storage device controller 118 may include logic to receive requests from CPU 102 (e.g., via CPU memory controller 112 or I/O controller 110), cause the requests to be carried out with respect to the memory chips 116, and provide data associated with the requests to CPU 102 (e.g., via CPU memory controller 112 or I/O controller 110). Controller 118 may also be operable to detect and/or correct errors encountered during memory operations via an error correction code (ECC engine). In an embodiment, controller 118 also tracks, e.g., via a wear leveling engine, the number of times particular cells (or logical groupings of cells) have been written to in order to perform wear leveling, detect when cells are nearing an estimated number of times they may be reliably written to, and/or adjust read operations based on the number of times cells have been written to. In performing wear leveling, the storage device controller 118 may evenly spread out write operations among the cells of memory chips 116 in an attempt to equalize the number of operations (e.g., write operations) performed by each cell. In various embodiments, controller 118 may also monitor various characteristics of the storage device 106 such as the temperature or voltage and report associated statistics to the CPU 102. Storage device controller 118 can be implemented on the same circuit board or device as the memory chips 116 or on a different circuit board or device. For example, in some environments, storage device controller 118 may be a centralized storage controller that manages memory operations for multiple different storage devices 106 of computer system 100.

In various embodiments, the storage device 106 also includes program control logic 124 which is operable to control the programming sequence performed when data is written to or read from a memory chip 116. In various embodiments, program control logic 124 may provide the various voltages (or information indicating which voltages should be provided) that are applied to memory cells during the programming and/or reading of data (or perform other operations associated with read or program operations), perform error correction, and perform other suitable functions.

In various embodiments, the program control logic 124 may be integrated on the same chip as the storage device controller 118 or on a different chip. In the depicted embodiment, the program control logic 124 is shown as part of the storage device controller 118, although in various embodiments, all or a portion of the program control logic 124 may be separate from the storage device controller 118 and communicably coupled to the storage device controller 118. For example, all or a portion of the program control logic 124 described herein may be located on a memory chip 116. In various embodiments, reference herein to a "controller" may refer to any suitable control logic, such as storage device controller 118, chip controller 126, or a partition controller. In some embodiments, reference to a controller may contemplate logic distributed on multiple components, such as logic of a storage device controller 118, chip controller 126, and/or a partition controller.

In various embodiments, storage device controller 118 may receive a command from a host device (e.g., CPU 102), determine a target memory chip for the command, and communicate the command to a chip controller 126 of the target memory chip. In some embodiments, the storage device controller 118 may modify the command before sending the command to the chip controller 126.

In various embodiments, the storage device controller 118 may send commands to memory chips 116 to perform host-initiated read operations as well as device-initiated read operations. A host-initiated read operation may be performed in response to reception of a read command from a host coupled to the storage device 106, such as CPU 102. A device-initiated read operation may be a read operation that is performed in response to a device-initiated read command generated by the storage device 106 independent of receiving a read command from the host. In various embodiments, the storage device controller 118 may be the component that generates device-initiated read commands. The storage device 106 may initiate a device-initiated read command for any suitable reason. For example, upon power up of a storage device, the storage device 106 may initiate a plurality of read and write-back commands to re-initialize data of the storage device 106 (e.g., to account for any drift that has occurred while the storage device 106 or a portion thereof was powered off or has sat idle for a long period of time).

The chip controller 126 may receive a command from the storage device controller 118 and determine a target memory partition 122 for the command. The chip controller 126 may then send the command to a controller of the determined memory partition 122. In various embodiments, the chip controller 126 may modify the command before sending the command to the controller of the partition 122.

In some embodiments, all or some of the elements of system 100 are resident on (or coupled to) the same circuit board (e.g., a motherboard). In various embodiments, any suitable partitioning between the elements may exist. For example, the elements depicted in CPU 102 may be located on a single die (i.e., on-chip) or package or any of the elements of CPU 102 may be located off-chip or off-package. Similarly, the elements depicted in storage device 106 may be located on a single chip or on multiple chips. In various embodiments, a storage device 106 and a computing host (e.g., CPU 102) may be located on the same circuit board or on the same device and in other embodiments the storage device 106 and the computing host may be located on different circuit boards or devices.

The components of system 100 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments, an integrated I/O subsystem includes point-to-point multiplexing logic between various components of system 100, such as cores 114, one or more CPU memory controllers 112, I/O controller 110, integrated I/O devices, direct memory access (DMA) logic (not shown), etc. In various embodiments, components of computer system 100 may be coupled together through one or more networks comprising any number of intervening network nodes, such as routers, switches, or other computing devices. For example, a computing host (e.g., CPU 102) and the storage device 106 may be communicably coupled through a network.

Although not depicted, system 100 may use a battery and/or power supply outlet connector and associated system to receive power, a display to output data provided by CPU 102, or a network interface allowing the CPU 102 to communicate over a network. In various embodiments, the battery, power supply outlet connector, display, and/or network interface may be communicatively coupled to CPU 102. Other sources of power can be used such as renewable energy (e.g., solar power or motion based power).

Storage device SRAM 130 and chip SRAM 128 each are adapted to execute internal firmware or software of the storage device 106 and memory chip 116 respectively. For example, the logic to be implemented by program control logic 124, upon the issuance of a command, for example from the host or CPU 102 to execute the logic, may be moved from a memory storing the logic to SRAM 130 (such as a NVM—not shown) such that the logic may be executed by the storage device controller 118 which will have access to the logic instructions by way of the associated SRAM 128. Similarly, the logic to be implemented by the chip controller 126, upon the issuance of a command, for example from the host or CPU 102 to execute the logic, may be moved from a memory storage the logic to the associated SRAM 128 (such as a NVM—not shown) such that the logic may be executed by the associated chip controller 126 which will have access to the logic instructions by way of the associated SRAM 128.

Figure 2:
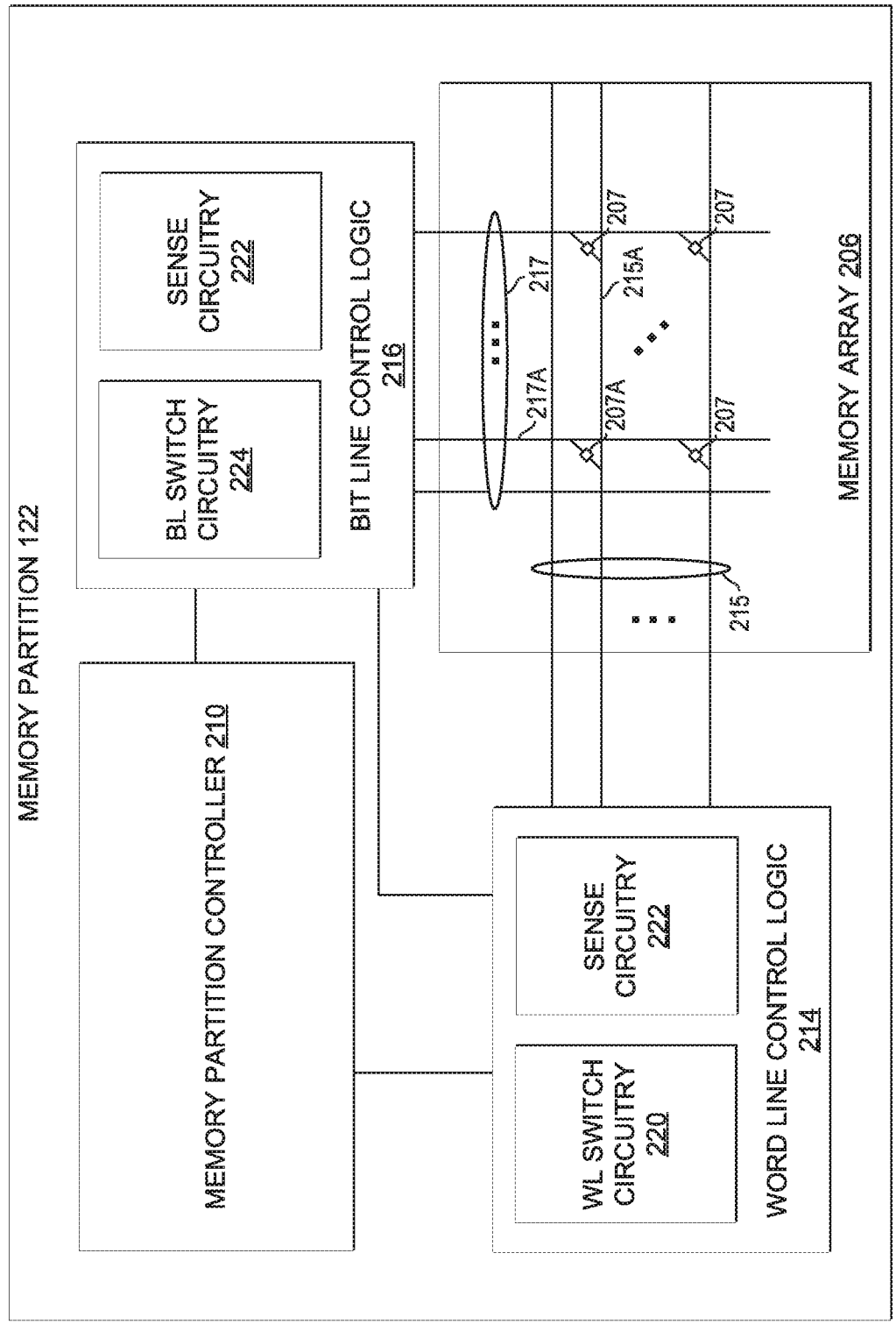
FIG. 2 is a schematic illustration of a memory partition in accordance with certain embodiments.

FIG. 2 illustrates a detailed exemplary view of the memory partition 122 of FIG. 1 in accordance with certain embodiments. In one embodiment, a memory partition 122 may include 3D crosspoint memory which may include phase change memory or other suitable memory types. In a particular embodiment, phase change memory may utilize a chalcogenide material for memory elements. A memory element is a unit of a memory cell that actually stores the information. In operation, phase change memory may store information on the memory element by changing the phase of the memory element between amorphous and crystalline phases. The material of a memory element (e.g., the chalcogenide material) may exhibit either a crystalline or an amorphous phase, exhibiting a low or high conductivity. Generally, the amorphous phase has a low conductivity (high impedance) and is associated with a reset state (logic zero) and the crystalline phase has a high conductivity (low impedance) and is associated with a set state (logic one). The memory element may be included in a memory cell 207 (e.g., a phase change memory cell) that also includes a selector, i.e., a select device coupled to the memory element. The select devices are configured to facilitate combining a plurality of memory elements into an array.

In some embodiments, a 3D crosspoint memory array 206 may comprise a transistor-less (i.e., at least with respect to the data storage elements of the memory) stackable crosspoint architecture in which memory cells 207 sit at the intersection of row address lines and column address lines arranged in a grid. The row address lines 215 and column address lines 217, called word lines (WLs) and bit lines (BLs), respectively, cross in the formation of the grid and each memory cell 207 is coupled between a WL and a BL where the WL and BL cross (i.e., crosspoint). At the point of a crossing, the WL and BL may be located at different vertical planes such that the WL crosses over the BL but does not physically touch the BL. As described above, the architecture may be stackable, such that a word line may cross over a bit line located beneath the word line and another bit line for another memory cell located above the word line. It should be noted that row and column are terms of convenience used to provide a qualitative description of the arrangement of WLs and BLs in crosspoint memory. In various embodiments, the cells of the 3D crosspoint memory array may be individually addressable. In some embodiments, bit storage may be based on a change in bulk resistance of a 3D crosspoint memory cell. In various embodiments, 3D crosspoint memory may include any of the characteristics of 3D XPoint memory manufactured by INTEL CORPORATION and/or MICRON TECHNOLOGY, INC.

During a programming operation (i.e., a write operation), the phase of the memory element may be changed by the application of a first bias voltage to the WL and a second bias voltage to the BL resulting in a differential bias voltage across the memory cell that may cause a current to flow in the memory element. The differential bias voltage may be maintained across the memory cell for a time period sufficient to cause the memory element to "snap back" and **to transition the memory element from the amorphous state to the crystalline state or from the crystalline state to the amorphous state (e.g., via the application of heat produced by an electric current). Snap back is a property of the composite memory element that results in an abrupt change in conductivity and an associated abrupt change in the voltage across the memory element.

In a read operation, a target memory cell is selected via the application of a first bias voltage to the WL and a second bias voltage to the BL that cross at the target memory cell for a time interval. A resulting differential bias voltage (a demarcation read voltage (VDM)) across the memory element is configured to be greater than a maximum set voltage and less than a minimum reset voltage for the memory element.

In response to application of the VDM, the target memory element may or may not snap back, depending on whether the memory element is in the crystalline state (set) or the amorphous state (reset). Sense circuitry, coupled to the memory element, is configured to detect the presence or absence of snap back in a sensing time interval. The presence of snap back may then be interpreted as a logic one and the absence of snap back as a logic zero.

The differential bias at which a memory cell transitions from being sensed as a logic one (e.g., due to the memory cell snapping back) to being sensed as a logic zero (e.g., due to the memory cell not snapping back), may be termed a threshold voltage (sometimes referred to as a snap back voltage). Thus, when the VDM is higher than the threshold voltage of the memory cell, the memory cell may be sensed as storing a logic one and when the VDM is lower than the threshold voltage of the memory cell, the memory cell may be sensed as storing a logic zero.

In some embodiments, an applied bias such as the VDM of a read pulse may be high enough to only turn on 3D crosspoint cells in the crystalline state, which may have a lower threshold voltage than 3D crosspoint cells in the amorphous state. In some embodiments, the VDM may be supplied through negative and/or positive regulated nodes. For example, the bitline electrode of the 3D crosspoint cell may be a positive regulated node and the wordline electrode coupled to the cell may supply the bias for VDM.

For a write operation or a read operation, one memory cell 207A out of many cells, such as thousands of cells, may be selected as the target cell for the read or write operation, the cell being at the cross section of a BL 217A and a WL 215A. All cells coupled to BL 217A and all cells coupled to WL 215A other than cell 207A may still see approximately ½ of VDM, with only cell 207A seeing the full VDM.

In the embodiment of FIG. 2, a memory partition 122 includes memory partition controller 210, word line control logic 214, bit line control logic 216, and memory array 206. A host device (e.g., CPU 102) may provide read and/or write commands including memory address(es) and/or associated data to memory partition 122 (e.g., via storage device controller 118 and chip controller 126) and may receive read data from memory partition 122 (e.g., via the chip controller 126 and storage device controller 118). Similarly, storage device controller 118 may provide host-initiated read and write commands or device-initiated read and write commands including memory addresses to memory partition 122 (e.g., via chip controller 126). Memory partition controller 210 (in conjunction with word line control logic 214 and bit line control logic 216) is configured to perform memory access operations, e.g., reading one or more target memory cells and/or writing to one or more target memory cells.

Memory array 206 corresponds to at least a portion of a 3D crosspoint memory (e.g., that may include phase change memory cells or other suitable memory cells) and includes a plurality of word lines 215, a plurality of bit lines 217 and a plurality of memory cells, e.g., memory cells 207. Each memory cell is coupled between a word line ("WL") and a bit line ("BL") at a crosspoint of the WL and the BL. Each memory cell includes a memory element configured to store information and may include a memory cell select device (i.e., selector) coupled to the memory element. Select devices may include ovonic threshold switches, diodes, bipolar junction transistors, field-effect transistors, etc.

Memory array 206 may be configured to store binary data and may be written to (i.e., programmed) or read from.

Memory partition controller 210 may manage communications with chip controller 126 and/or storage device controller 118. In a particular embodiment, memory partition controller 210 may analyze one or more signals received from another controller to determine whether a command sent via a bus is to be consumed by the memory partition 122. For example, controller 210 may analyze an address of the command and/or a value on an enable signal line to determine whether the command applies to the memory partition 122. Controller 210 may be configured to identify one or more target WLs and/or BLs associated with a received memory address (this memory address may be a separate address from the memory partition address that identifies the memory partition 122, although in some embodiments a portion of an address field of a command may identify the memory partition while another portion of the address field may identify one or more WLs and/or BLs). Memory partition controller 210 may be configured to manage operations of WL control logic 214 and BL control logic 216 based, at least in part, on WL and/or BL identifiers included in a received command.

WL control logic 214 includes WL switch circuitry 220 and sense circuitry 222. WL control logic 214 is configured to receive target WL address(es) from memory partition controller 210 and to select one or more WLs for reading and/or writing operations. For example, WL control logic 214 may be configured to select a target WL by coupling a WL select bias voltage to the target WL. WL control logic 214 may be configured to deselect a WL by decoupling the target WL from the WL select bias voltage and/or by coupling a WL deselect bias voltage to the WL. WL control logic 214 may be coupled to a plurality of WLs 215 included in memory array 206. Each WL may be coupled to a number of memory cells corresponding to a number of BLs 217. WL switch circuitry 220 may include a plurality of switches, each switch configured to couple (or decouple) a respective WL, e.g., WL 215A, to WL select bias voltage to select the respective WL 215A. For example, switch circuitry 220 may include a plurality of transistors.

BL control logic 216 includes BL switch circuitry 224. In some embodiments, BL control logic 216 may also include sense circuitry, e.g., sense circuitry 222. BL control logic 216 is configured to select one or more BLs for reading and/or writing operations. BL control logic 216 may be configured to select a target BL by coupling a BL select bias voltage to the target BL. BL control logic 216 may be configured to deselect a BL by decoupling the target BL from the BL select bias voltage and/or by coupling a BL deselect bias voltage to the BL. BL switch circuitry 224 is similar to WL switch circuitry 220 except BL switch circuitry 224 is configured to couple the BL select bias voltage to a target BL.

Sense circuitry 222 is configured to detect the state of one or more sensed memory cells 207 (e.g., via the presence or absence of a snap back event during a sense interval), e.g., during a read operation. Sense circuitry 222 is configured to provide a logic level output related to the result of the read operation to, e.g., memory partition controller 210. For example, a logic level corresponding to a logic one may be output if the applied VDM is higher than the memory cell's threshold voltage or a logic zero if the applied VDM is lower than the memory cell's threshold voltage. In a particular embodiment, a logic one may be output if a snap back is detected and a logic zero may be output if a snap back is not detected.

As an example, in response to a signal from memory partition controller 210, WL control logic 214 and BL control logic 216 may be configured to select one or more target memory cells, e.g., memory cell 207A, for a read operation by coupling WL 215A to WL select bias voltage and BL 217A to BL select bias voltage. One or both of sense circuitries 222 may then be configured to monitor WL 215A and/or BL 217A for a sensing interval in order to determine the state of the memory cell 207A (e.g., to determine whether or not a snap back event occurs). For example, if a sense circuitry 222 detects a snap back event, then memory cell 207A may be in the set state, but if a sense circuitry 222 does not detect a snap back event in the sensing interval, then memory cell 207A may be in the reset state.

Thus, WL control logic 214 and/or BL control logic 216 may be configured to select a target memory cell for a read operation, initiate the read operation, sense the selected memory cell (e.g., for a snap back event) in a sensing interval, and provide the result of the sensing to, e.g., memory partition controller 210.

In a particular embodiment, the sense circuitry 222 may include a wordline (WL) load connected to a WL electrode or gate, and a bitline (BL) load connected to a bitline electrode or gate. When a particular wordline and bitline are selected in the array, a different between WL load or WL voltage and the BL voltage correspond to a read VDM. VDM may induce a current in the memory cell 207A, icell. A comparator such as a sense amplifier may compare icell with a reference current in order to read a logic state one or logic state zero depending on whether the memory cell is a set cell or a reset cell. The reference current may thus be selected such that the current of the target memory cell is lower than the reference current before snapback of the target memory cell and higher than the reference current after snapback of the target memory cell. In this manner, an output of the sense amplifier/comparator may be indicative of a state of the target memory cell. A latch may be coupled to the output of the comparator to store the output of the read operation. In some embodiments, leakage components of the current can be mitigated by respectively selecting a bias for all other unselected wordlines and bitlines that reduces or minimizes leakage. Capacitive components of the current can be mitigated by allowing sufficient time for the capacitive components to dissipate.

For each matrix of arrays, there may be a sense amplifier provided. Each partition 122 may have 128 such matrices, hence 128 sense amplifiers. Each partition may be read from one read operation.

Figure 3:
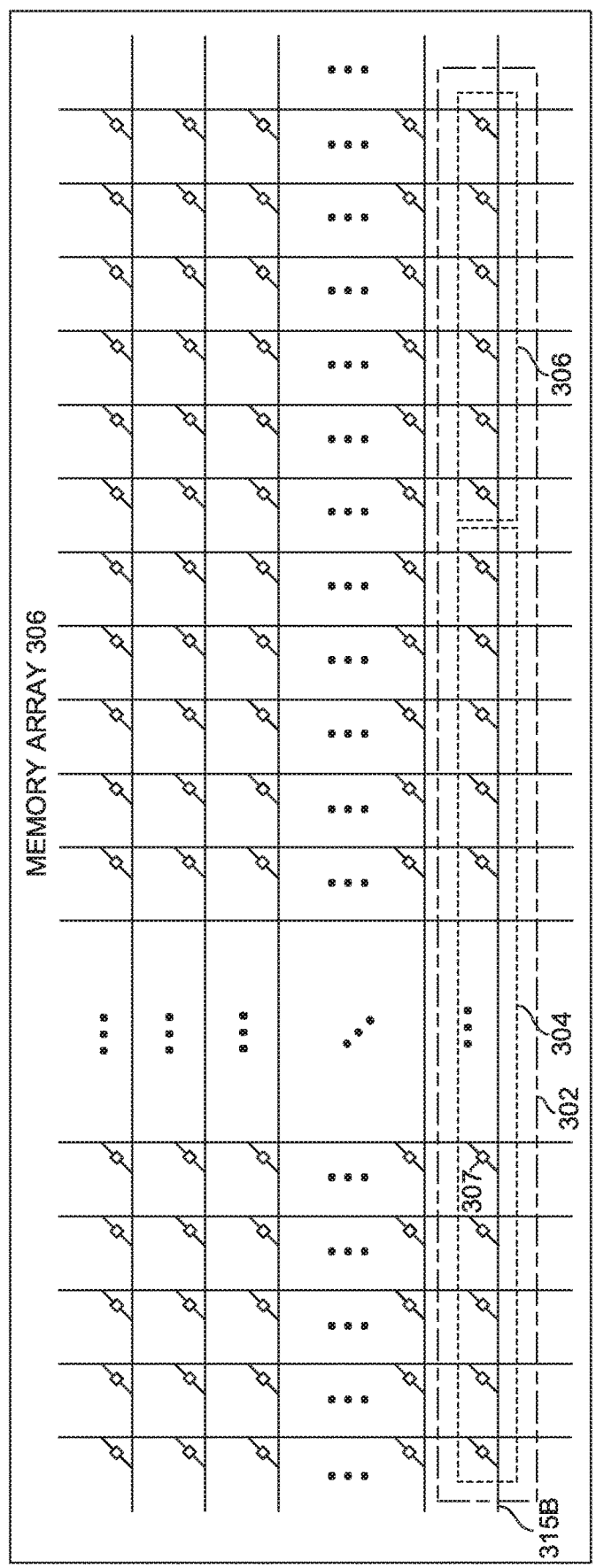
FIG. 3 is a schematic illustration of a memory array in accordance with certain embodiments.

FIG. 3 illustrates a detailed exemplary view of the memory array 206 of FIG. 2 in accordance with certain embodiments. In various embodiments, a plurality of memory cells 207 of memory array 206 may be divided into a logical group such as a slice 302 (and the memory array 206 may include a plurality of slices). In the embodiment depicted, slice 302 includes a plurality of memory cells 207 coupled to the same WL 215A, though a slice 302 may comprise any suitable arrangement of memory cells.

In a particular embodiment, a slice may include a payload portion 304 and a metadata portion 306. The memory cells of the payload portion 304 may store data written to the storage device 106 by a host (e.g., CPU 102/104). For example, the host may send a write command specifying payload data to be written to the storage device 106 at a particular logical address. The payload of the write command may be stored in a payload portion 304 of one or more slices 302 (in various embodiments, the payload portion 304 may be large enough to hold payload data from multiple write commands from the host). In various embodiments, the size of the payload portion of a slice may have any suitable size, such as 1 kibibyte (KiB), 2KiB, 4KiB, 8KiB, or other suitable size.

The memory cells of the metadata portion 306 of a slice 302 may store metadata associated with the payload data stored in the payload portion 304 of the slice 302 or the slice itself. The metadata portion 306 may store any suitable metadata associated with the payload data or slice. For example, the metadata portion 306 may store parity bits and/or cyclic redundancy check (CRC) bits used during error detection and error correction, e.g., by the storage device controller 118. In alternative embodiments, error detection and/or correction may be performed at any suitable level on the storage device 106, such as by the chip controllers 126 or partition controllers 210.

Figure 4:
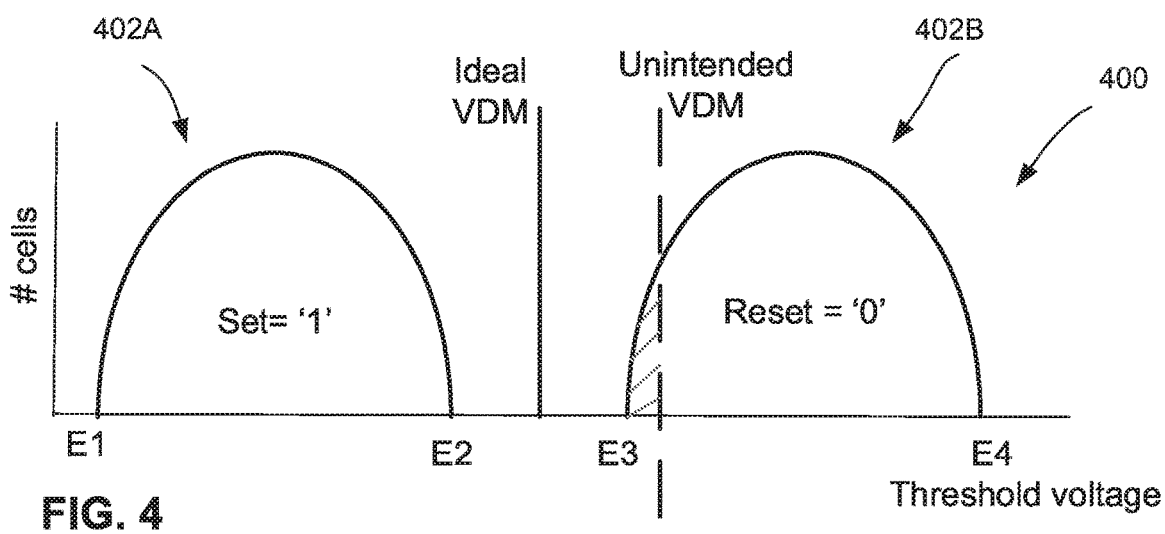
FIG. 4 is a graph depicting memory cell threshold voltage distributions and demarcation voltages in accordance with certain embodiments for a single level cell memory.

FIG. 4 illustrates a plot or graph 400 depicting memory cell threshold voltage statistical distributions 402A for set cells (storing a bit 1), and 402B for reset cells (storing a bit 0) (these are meant to represent bell curves for example), an ideal read voltage "ideal VDM" and an unintended read voltage "unintended VDM".

In FIG. 4, the horizontal axis depicts threshold voltages of memory cells of a single level cell array and the vertical axis depicts bit counts (i.e., number of memory cells). Thus, each point of a distribution 402A/402B represents a number of cells having a particular threshold voltage. The graph 400 assumes that half of the bits of the array are in a set state (i.e., have a threshold voltage lower than the corresponding VDM) and half of the bits are in a reset state (i.e., have a threshold voltage higher than the corresponding VDM). Distributions 402A and 402B represents a baseline distribution that may correspond to a threshold voltage distribution at a particular point in time.

In a read operation, a target memory cell, such as cell 207A, is selected via the application of a first bias voltage to the WL 215A and a second bias voltage to the BL 217A that cross at the target memory cell for a time interval. A resulting differential bias voltage (a demarcation read voltage (VDM)) across the memory element is configured to be greater than a maximum set voltage E2 and less than a minimum reset voltage E3 for the memory element.

In response to application of the VDM, the target cell may or may not snap back, depending on whether the target cell is in the crystalline state (set) or the amorphous state (reset), as suggested in FIG. 4. If the target cell is in a set state, application of the VDM would cause the set cell to snap back, in which case the target cell would be read as a logic one, and if the target cell is in a reset state, application of the VDM, ideally, would not cause the reset cell to snap back, in which case the target cell would be read as a logic zero. Sense circuitry, coupled to the memory cell, is configured to detect the presence or absence of snap back in a sensing time interval. The presence of snap back may then be interpreted as a logic one and the absence of snap back as a logic zero as noted above.

The differential bias at which a memory cell transitions from being sensed as a logic one (e.g., due to the memory cell snapping back) to being sensed as a logic zero (e.g., due to the memory cell not snapping back), may be termed a threshold voltage (sometimes referred to as a snap back voltage). Thus, when the VDM is higher than the threshold voltage of the memory cell as shown in FIG. 4, the memory cell may be sensed as storing a logic one and when the VDM is lower than the threshold voltage of the memory cell, the memory cell may be sensed as storing a logic zero.

In some embodiments, an applied bias such as the VDM of a read pulse may be high enough to only turn on 3D crosspoint cells in the crystalline state, which may have a lower threshold voltage than 3D crosspoint cells in the amorphous state. In some embodiments, the VDM may be supplied through negative and/or positive regulated nodes. For example, the bitline electrode of the 3D crosspoint cell may be a positive regulated node and the wordline electrode coupled to the cell may supply the bias for VDM and be a negative regulated node.

Figure 5:
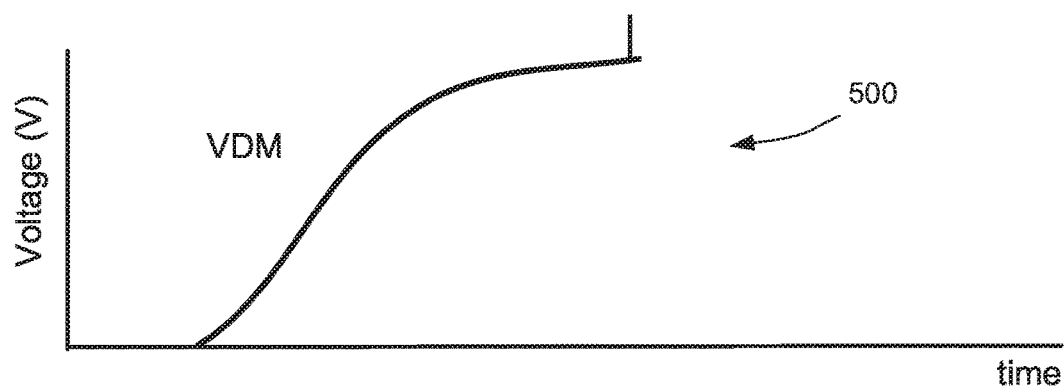
FIG. 5 is a graph showing VDM plotted against time during a read operation corresponding to the cells of FIG. 4.

Referring now to FIG. 4 and FIG. 5, ideally, a VDM applied between E2 and E3 would provide the necessary voltage to read a logic 1 or logic 0 depending on whether the target cell is a set cell or a reset cell. FIG. 5 shows a graph 500 plotting VDM over time. As shown in FIG. 5, during read operations, the ideal VDM applied may sometimes ramp up to an unintended VDM level, which may be high enough to snap at least some of the reset cells of an array, because the unintended VDM may be higher than a minimum threshold voltage of the distribution of reset cells. In such a case, the sense circuitry, such as a sense amplifier, will detect the snapped reset cells as a logic one, although in reality their logic state should be read as a logic zero. If a current comparator sense amplifier is used, for example, the logic state of snapped reset cells could be sensed as a logic one because of the high current flowing through the same by virtue of the snap back. The latter is because a lot of current can flow through a set cell. Whereas leakage current, which occurs in reset cells, is in the range of nanoamps or low microamps, current in a set cell can for example be in the tens of microamps, potentially about 1000 times larger than the case of a reset cell, and this is what is detected by a current based sense amplifier to sense a logic one.

Because of the unintended VDM problem highlighted with respect to FIG. 4 above, where a reset cell may snap as a result of unintended VDM ramp up and be read as a logic one, voltage reduction during a read algorithm may improve the read window/read sense margin without impacting the sensing scheme and current delivery through the memory cell. Because of the unintended VDM issue, the read sense margin (that is, the read window corresponding to the voltage difference between E3 and E2) in reality becomes smaller, because an ideal VDM would have to fit within a tighter voltage range in order for any ramp up to an unintended VDM to not cause unintended snap back of reset cells.

VDM reduction may be achieved in three ways, including by way of a reduction of BL voltage, a reduction of WL voltage absolute value (since the WL voltage is typically negative), or a reduction of both BL voltage & WL voltage absolute value. A goal of VDM reduction is to cause a snap back of set cells but no snap back of any reset cells during a read operation.

Figure 6:
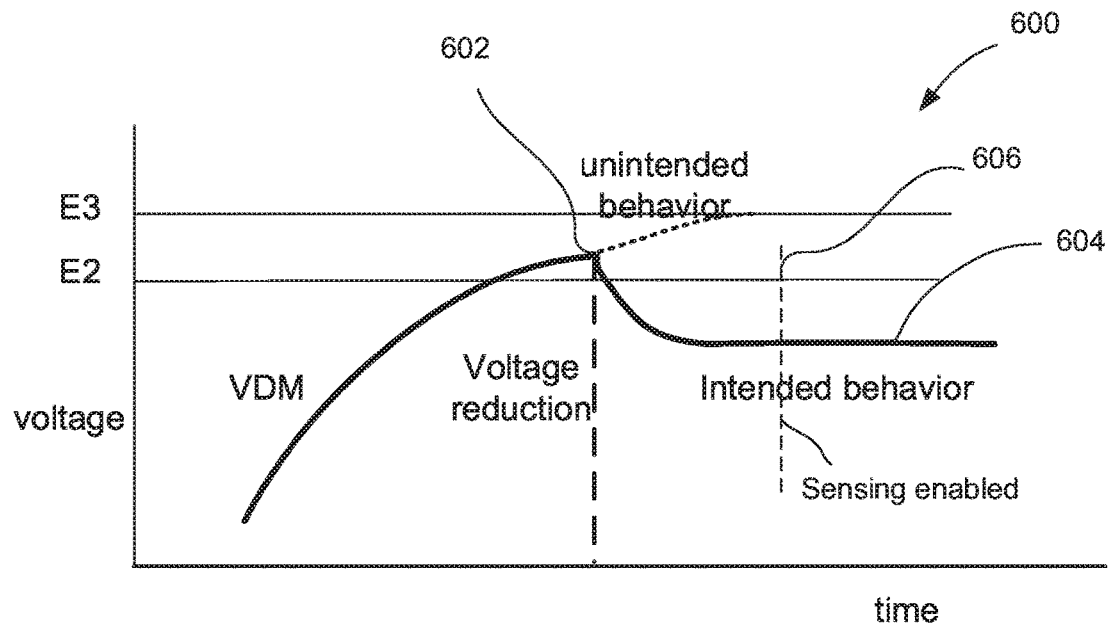
FIG. 6 is a graph showing VDM plotted against time during a read operation corresponding to the cells of FIG. 4, but with a reduction in VDM and the attendant delay mandated before sensing.

Referring now to FIG. 6, a graph 600 shows VDM as a function of time where the VDM undergoes a reduction during a read operation so as to snap the set cells but avoid snapping the reset cells. VDM may be set to ramp to a level 602 between E2 and E3 to snap the set cells, and then be reduced, for example by 50 mV, and achieve a steady-state voltage 604 to enable the sensing circuitry to perform a read operation 606. However, such a voltage reduction scheme disadvantageously introduces delay into the reading operation by virtue of the time difference between sensing at 606 and start of reduction of VDM at 602. A delay such as the one highlighted with respect to FIG. 6 can negatively affect devices that require low latency/high speed memory operations. The delay may occur because capacitors that are part of a memory cell circuitry may need to transition to a steady state with respect to their voltages after the voltage reduction at 702 before a sense amplifier can accurately sense VDM or a current resulting therefrom.

Figure 7:
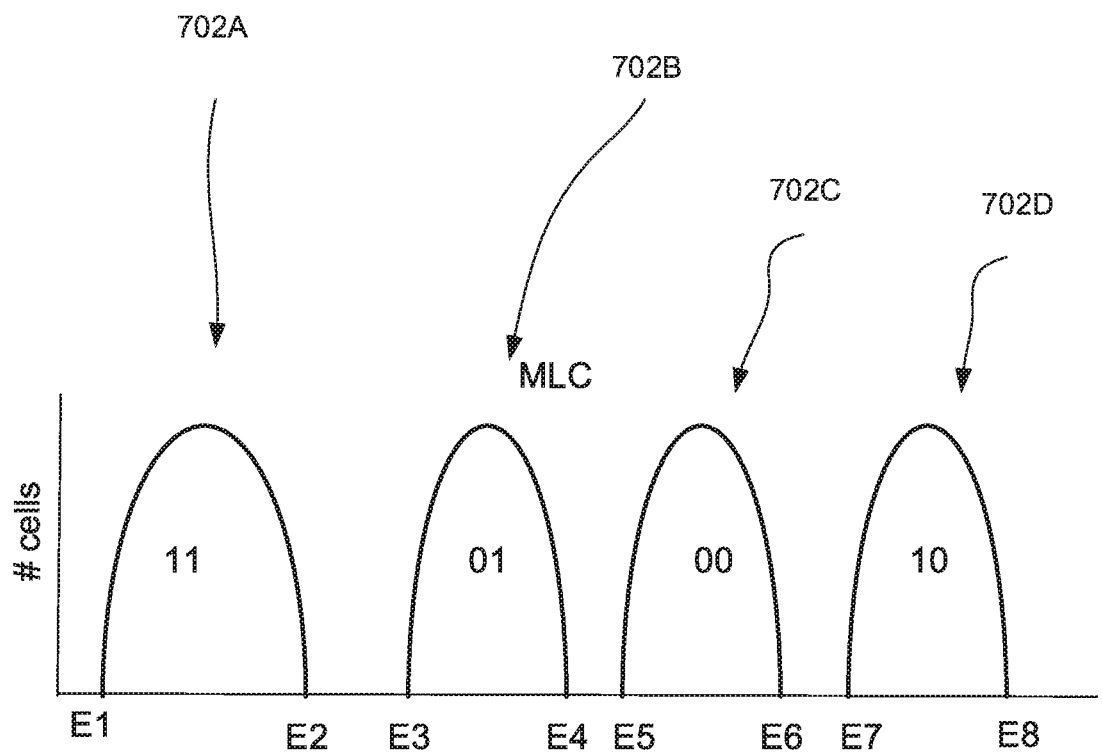
FIG. 7 is a figure similar to FIG. 4, but for a multi-level cell memory.

Although the graphs of FIG. 4, FIG. 5 and FIG. 6 have been shown in the context of a single level cell (SLC) memory, the same issues as outlined herein with respect to FIGS. 4-6 are equally applicable in the cases of multi level cell (MLC) memories, triple level cell (TLC) memories, quad level cell (QLC) memories, penta level cell (PLC) memories, or any other memories involving memory cell array. In particular, the unintended VDM issue may affect any memory cell that may be programmed according to a particular encoding scheme and readable using the application of a voltage such as VDM. A memory cell can be programmed according to one or more encoding schemes such as SLC (single level cell), MLC (multi-level cell) as shown in FIG. 7, TLC (triple level cell), QLC (quad level cell), or other encoding scheme. In a SLC memory, each memory cell has two voltage levels corresponding to two states (0, 1) to represent one bit. In a MLC, TLC and QLC memory, each memory cell stores two or more bits. Each cell in a MLC memory uses four voltage levels corresponding to four states (00, 01, 10, 11) to represent 2 bits of binary data. Each cell in a TLC memory uses eight voltage levels corresponding to eight states (000 to 111) to represent 3 bits of binary data. Each cell in a QLC memory uses sixteen voltage levels corresponding to sixteen states (0000 to 1111) to represent 4 bits of binary data. In one example, each cell's threshold voltage is indicative of the data that is stored in the cell.

By way of example, FIG. 7 shows a graph similar to FIG. 4 for a MLC memory, including distributions 702A for cells with state 11, 702B for cells with state 01, 702C for cells with state 00, and 702D for cells with state 10. Here, the VDM between E2 and E3 may for example cause the same unintended VDM issues as those outlined with respect to the SLC example of FIG. 4.

Prior art sensing and voltage reduction circuits offer a compromise between successful read operations and yield. For example, a disturbance in circuit operations due to switching signals related to the BL side can impact the read sense margin.

Although not considered a robust solution, the prior art has implemented a voltage mode sensing circuit or sense amplifier circuit that is electrically connected to the WL side circuitry of a memory array. In such a scenario, any BL side disturbances from signal switching would be less likely to affect sensing. On the other hand, WL side signal switching could affect the voltage mode sensing margin.

The prior art has further implemented a current mode sense circuitry connected to the BL side rather than a voltage mode circuit. The current mode sense circuitry implementation is generally a circuit that exhibits a higher bandwidth (i.e. faster to execute sensing) as compared to the voltage mode sensing circuit connected to the BL side. Thus, although a voltage mode sensing circuit can be implemented on the BL side, the current mode sense circuitry implementation is more robust from a signal-to-noise perspective over the voltage mode circuitry regardless of whether it is connected to the BL or WL side. A voltage mode sensing implementation would however not provide a solution to the read operation problem as noted above, or to BL side voltage disturbances due to signal switching.

According to some embodiments, a voltage reduction across a memory cell during a read operation is implemented by one of reducing an absolute value of a voltage at a WL of a memory cell when a sensing circuit for the memory cell is connected to a BL of the memory cell, or reducing an absolute value of a voltage of a BL of the memory cell when the sensing circuit for the memory cell is connected to a WL of the memory cell. Embodiments in this way improve read sense margin, and hence yield and bit error rate.

An advantage of voltage reduction at the line (WL or BL) that is opposite the line connected to the sensing circuit for the memory cell is that sensing could occur substantially at the time of voltage reduction, that is, without the need for a delay to allow memory cell capacitors and other circuit elements to reach a steady voltage state. A scheme according to embodiments may be placed any time within the algorithm to optimize yield and bit error rate.

Although embodiments described below relate to the reduction of voltage absolute value at the WL side of a memory cell, it is to be understood that the same mechanisms would be applicable where the reduction of voltage is applied to the BL side where in that case, the sensing circuit is connected to the WL side.

An advantage of embodiments is that they result in a reduction in VDM, and hence in a better read sense margin by obviating the unintended VDM issues, without interfering with the sensing timing of the memory control circuits. Since embodiments use a current sensing scheme at the BL, any change in current on the BL side could interrupt the sensing scheme. As a result, a reduction in the absolute value of the voltage, which will bring current changes, is implemented on the WL side in order to not affect the current on the BL side of the memory cell, thus avoiding current increase or current reduction on the BL side as a result of a reduction of VDM resulting from a reduction in the absolute value of the voltage on the WL side. In this way, the current mode sense circuitry, such as a current mode sense amplifier, on the BL side is decoupled from VDM reduction, thus providing the freedom to place VDM reduction anytime during any algorithm without impacting sensing operation.

Figure 8:
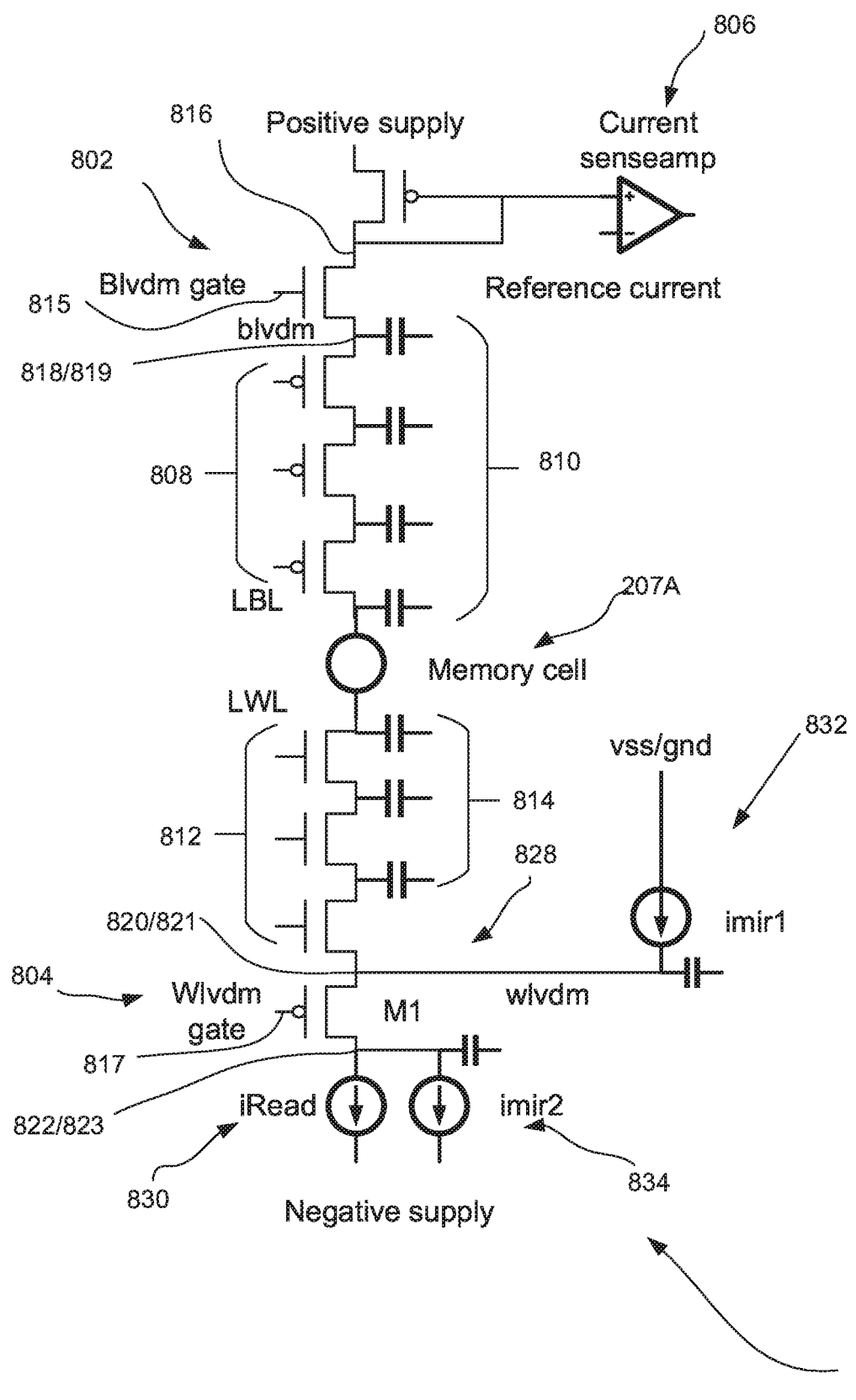
FIG. 8 is a schematic illustration of a memory circuitry including mirror current generation circuitries according to some embodiments.

Reference is now made to FIG. 8, which depicts memory circuitry 800 of a memory device, such as memory partition 122 of FIG. 1. Memory circuitry 800 depicts circuit elements including circuit nodes coupled to a memory cell 207A, corresponding for example to any memory cell 207 of memory array 206 as shown for example in FIGS. 2 and 3 described above. The example memory circuitry 800 includes BL metal oxide semiconductor field effect transistor (MOSFET) 802, shown in the figure as a n-type MOSFET or NMOS transistor, and a WL MOSFET 804 shown in the figure as a p-type MOSFET or PMOS transistor. BL NMOS 802 includes a BL gate or Blvdm gate 815 and two BL NMOS terminals 816 and 818, while WL 804 includes a WL gate or Wlvdm gate 817 and two WL PMOS terminals 820 and 822. VDM is the voltage across the memory cell 207A, and is defined as the difference between the voltage blvdm at the BL NMOS terminal 818, and the voltage wlvdm at the WL PMOS terminal 820. Although a NMOS transistor 802 is shown for the BL side and a PMOS transistor 804 is shown for the WL side in FIG. 8, embodiments are not so limited and include within their scope any circuitry to induce a VDM between two nodes, a BL node 819 configured to be at a first voltage blvdm, which in the shown example corresponds to BL terminal 818, and a WL node 821 configured to be at second voltage wlvdm, which in the shown example corresponds to WL node 821. Because the voltage applied to BL gate 815 is to be positive and the voltage applied to WL gate 817 is to be negative, the value of VDM corresponds to an addition of the absolute values of VBL and VWL. The memory cell 207A and its associated circuit elements are provided between the BL NMOS 802 and WL PMOS 804, and include a series of PMOS transistors 808 and associated capacitors 810 between the memory cell 207A and BL NMOS 802, and a series of PMOS transistors 812 and associated capacitors 814 as shown. Memory circuitry 800 further includes a sense amplifier 806 coupled to the memory cell 207A. The sense amplifier 806 compares the current flowing through the memory cell, icell, with a reference current iref as part of a read operation of memory cell 207A as the target cell. When memory cell 207An is a set cell, icell is to be larger than iref, and this signals a logic state one as sensed by the sense amplifier 806. When memory cell 207An is a reset cell, icell is to be smaller than iref and this signals a logic state zero as sensed by the sense amplifier 806. Sense amplifier 806 is a thus current mode sense amplifier which functions as a current comparator.

Referring still to FIG. 8, a MOSFET circuitry M1 or 828 is shown which includes WL PMOS 804 as described above, a read current generation circuitry 830 which is adapted to generate a read current iRead, and, in addition, a first mirror current generation circuitry 832 to generate a mirror current iMir1 within MOSFET circuitry 828 at the WL PMOS 804, and a second mirror current generation circuitry 834 to generate a second mirror current iMir2 within MOSFET circuitry 828 at the WL 804.

Recall that a gate voltage VWL is to be applied to WL gate 817. If we implement the first mirror current iMir1 within MOSFET circuitry 828 at WL node 821, the voltage wlvdm at WL node 821, which corresponds to source terminal 820 of WL PMOS 804, will have to increase (and, where the voltage at wlvdm is negative, its absolute value will therefore have to decrease), creating a larger difference between wlvdm and VWL (marked as Wlvdm gate in FIG. 8). This change will in turn increase the voltage difference between WLvdm (the voltage at the WL node 821) and WLvdmgate (or VWL at the WL gate 817). The above is because a higher gate to source (or VGS) voltage will be required to support a higher current coupled to WL node 821. Since VWL, the voltage applied to WL PMOS gate 817, is fixed and will not change, wlvdm will have to compensate for the generation of iMir1 at WL node 821 by increasing. Because the blvdm would not have changed, the increase in wlvdm (which would have a negative voltage having a decreased absolute value with respect to a wlvdm that would have been in place without iMir1) would result in a smaller VDM during a read operation. This is because, while the blvdm has a positive value, wlvdm has a lesser negative value, and a difference between blvdm and wlvdm would have been decreased by virtue of generation of iMir1 into the line connected to WL node 821 during a read operation.

Application of iMir1 to the WL node in the case of a reset cell would result in VDM being kept lower than the minimum threshold voltage of the reset cell distribution and in preventing an inadvertent snap back of the reset cell by virtue of an unintended VDM as explained with respect to FIGS. 4 and 5 above, while allowing the sense amplifier 806 to read the reset cell as a logic state zero without delay by virtue of the leakage current from the reset cell being below the reference current. The above is true since the change in the WL by virtue of generation of iMir1 does not impact the current at BL node 819, and the leakage through the BL NMOS 802 would be unaffected by application of iMir1. Thus, there would be no need for the voltage and/or current through capacitors 810 to reach a steady state before sensing the state of a reset cell that employs an iMir1 generation circuitry 828 as described. When VDM is decreased according to the prior art, as suggested in FIG. 6, the time at which the sense amplifier 806 can begin sensing the state of the target memory cell is set at a significant delay with respect to the time at which VDM is reached. If a current generation circuitry similar to circuitry 828 were to be applied at the BL node 819 rather than at the WL node 821, because the sense amplifier 806 is on the BL side, the extra current at the BL side would lower the voltage at the capacitors 810 in a transient manner, as the capacitance of those capacitors would have changed by virtue of the extra current. This would still require a delay in sensing the state of the memory cell 207A, since, if the memory cell 207A were sensed earlier, more current would be sensed and the cell 207A would erroneously be read as a logic state 1.

The circuit arrangement of FIG. 8 advantageously removes the unintended VDM problem explained above for a reset cell, and further allow sensing to happen almost immediately after application of the VDM, since the BL circuitry would not be affected by the generation of iMir1 into the WL node 821 and the resultant decrease in VDM therefrom.

With respect to application of iMir1 to the WL node 821 in the case of a set cell without more, the VDM would still be able to snap the cell for a logic state one read by sense amplifier 806 as it would still rise above the set cell's threshold voltage. However, one issue with respect to generating current at the WL node 821 may be a decrease in the current icell within the memory cell 207A. The generation of iMir1 at the WL node 821 would decrease the iRead current. Applying Kirchhoff's Current Law (KCL) at the drain of WL PMOS 804, corresponding to iRead node 823 and terminal 822 of WL PMOS 804, we will obtain Equation (1) below for a case where only iMir1 is applied to WL node 821:

$$i\text{cell} + i\text{Mir1} = i\text{Read} \qquad \text{Eq. (1)}$$

Because iRead is a constant, it is clear from Equation 1 that icell would decrease from application of iMir1. Given that the iRead generation circuitry 830 is to control icell. For a set cell, it is preferably to ensure that icell is above iref for the sense amplifier 806 in order to ensure a correct read of memory cell 207A as a logic state one. Thus, iMir1 will reduce the intended current delivery from the mirror iRead to the memory cell 207A. The memory cell 207A may not work correctly if it is a set cell where the reduction in iRead, and hence icell, is excessive. iMir2 may be added so that cell current stays substantially the same, or at a level that would allow a correct read of the cell. Embodiments do not require that iMir1 and iMir2 match exactly, as long as Equation (2) applies:

$$i\text{Mir2} \geq i\text{Mir1} \qquad \text{Eq. (2)}$$

In order to address the problem of lowered icell by virtue of application of iMir1 to WL node 821, the second mirror current generation circuitry 834 is thus to generate a second mirror current iMir2 within MOSFET circuitry 828 at the WL PMOS 804, and specifically at the node corresponding to the application of iRead, that is, to iRead node 823. The iRead node 823 in the shown embodiment corresponds to terminal 822 of WL PMOS 804. While the prior art includes the iRead generation circuitry 830, it does not include the iMir1 current generation circuitry 832, or the iMir 2 current generation circuitry 834. Applying KCL again in the case where iMir2 is generated at iRead node 823, we obtain Equation (3):

$$i\text{cell} + i\text{Mir1} = i\text{Read} + i\text{Mir2} \qquad \text{Eq. (3)}$$

The generation of iMir2 at iRead node 823 helps to counterbalance an effect of iMir1 on icell, and can help keep icell at a level that would allow a correct reading of memory cell 207A by current mode sense amplifier 806.

Adding iMir 2 increases the current on the iRead side to offset a current reduction in icell. If iMir1=iMir2, the two can cancel each other out, and as shown by way of Equation (3), icell=iRead. It is noted that wlvdm at WL node 821 is not dictated by iMir 2, but by iMir 1. Therefore, the generation of iMir2 at the iRead node 823 will still lower VDM in order to address the unintended VDM problem outlined above. In this way, we would advantageously be solving the unintended VDM problem to increase the read sense margin while ensuring that icell within a set cell is high enough to avoid any read errors by the current mode sense amplifier 806.

Figure 9:
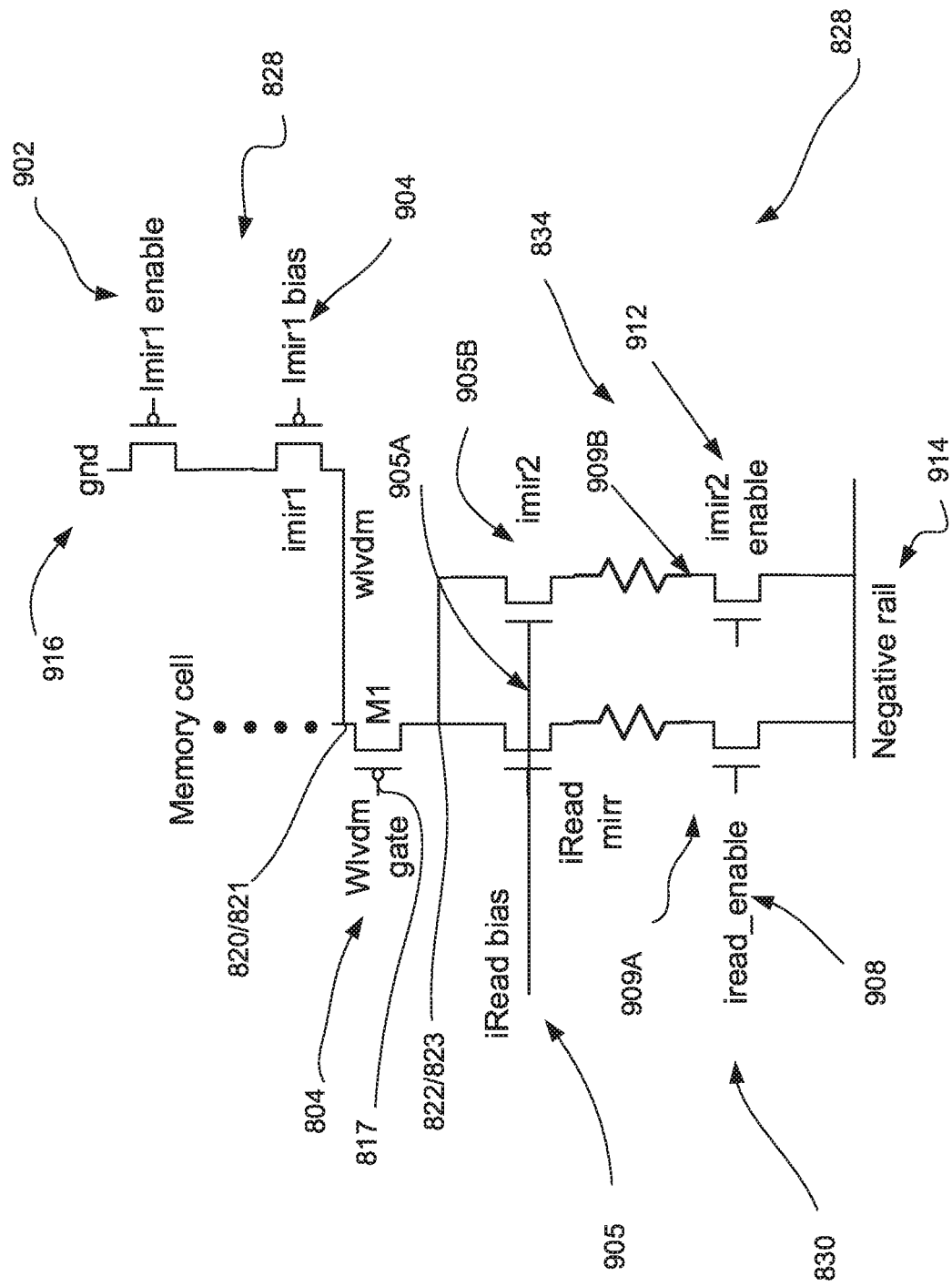
FIG. 9 is a schematic illustration of a metal oxide semiconductor field effect transistor (MOSFET) circuitry of FIG. 8 according to a first embodiment.
Figure 10:
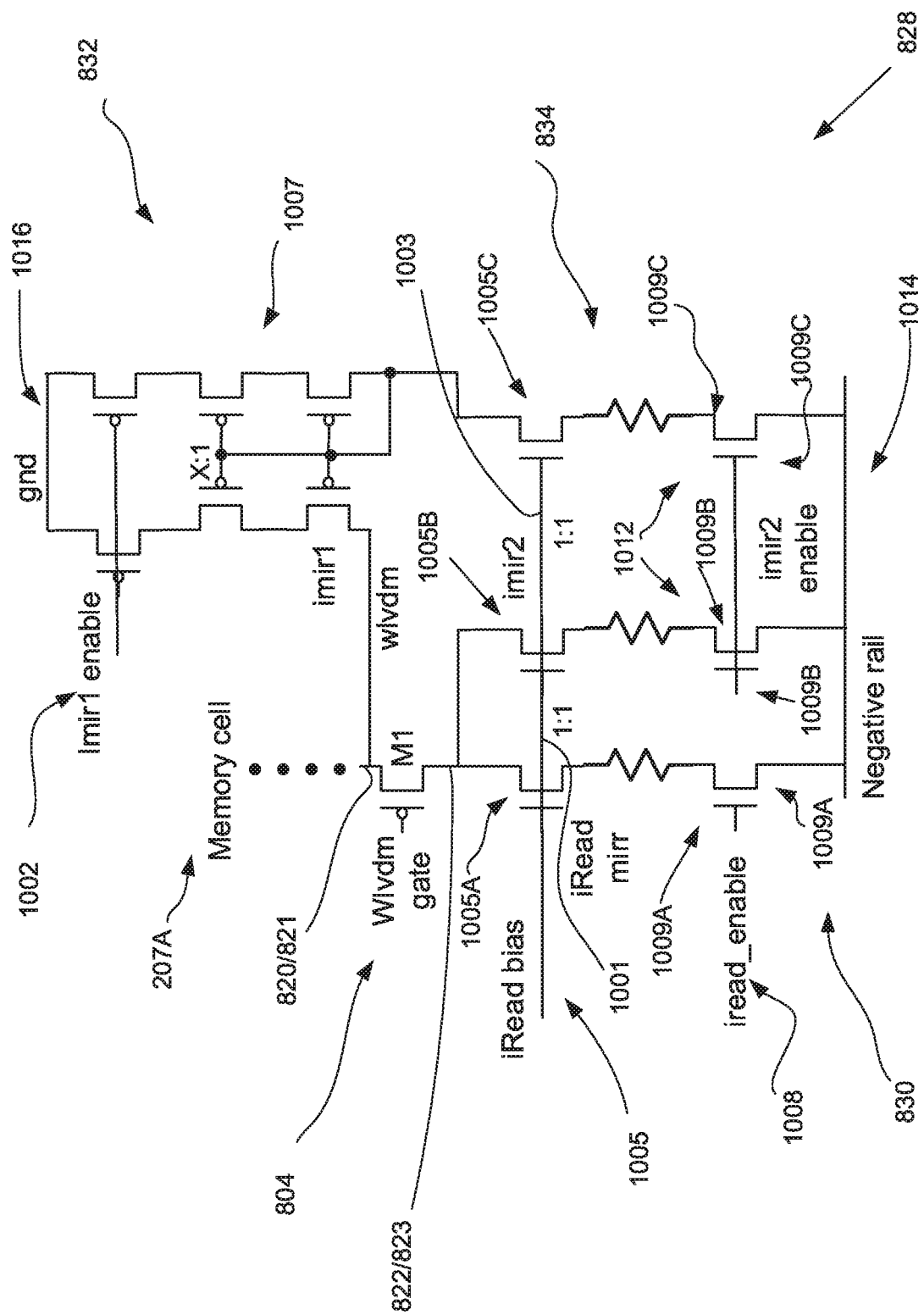
FIG. 10 is a schematic illustration of a metal oxide semiconductor field effect transistor (MOSFET) circuitry of FIG. 8 according to a second embodiment

We turn next to FIGS. 9 and 10, which show two different embodiments for the MOSFET circuitry 828. While FIG. 9 depicts a first mirror current generation circuitry 832 that includes a dedicated bias circuitry, FIG. 10 depicts a first mirror current generation circuitry 832 that is connected to the bias circuitry of the read generation circuitry 830.

Referring first to FIG. 9, MOSFET circuitry 828 is shown including the WL PMOS 804, terminals 820 (source) and 822 (drain), corresponding to WL node 821 and iRead node 823 respectively, iRead generation circuitry 830, iMir1 current generation circuitry 832, and iMir2 current generation circuitry 834. In the shown embodiment of FIG. 9, iMir1 current generation circuitry 832 includes a dedicated bias circuitry 904, which in the shown example of FIG. 9, includes a transistor, such as a PMOS transistor, and an iMir1 enable circuitry 902 which in the shown example of FIG. 9 includes a transistor, such as PMOS transistor. iMir1 enable circuitry 902 is to enable and disable iMir1, and iMir1 dedicated bias circuitry 904 is to provide the bias for the generation of iMir1 at WL node 821. In the shown embodiment, iRead generation circuitry 830 includes an iRead bias circuitry 905, including, in the shown embodiment, a NMOS transistors 905A, and an iRead enable circuitry 908, including, in the shown embodiment, a NMOS transistor 909A. In the shown embodiment of FIG. 9, iMir2 current generation circuitry 834 is coupled to the iRead bias circuitry 905 in such a way that the iRead bias circuitry provides the bias to the iMir2 current generation circuitry 834. In the shown embodiment, iRead bias circuitry supplies the bias to iMir2 generation circuitry 834 by way of NMOS 905B connected to NMOS 905A of iRead generation circuitry 830. iMir2 generation circuitry further includes an iMir2 enable circuitry 912 which in the shown example of FIG. 9 includes a transistor, such as an NMOS transistor 909B. iMir2 enable circuitry 902 is to enable and disable iMir2, and iRead bias circuitry 905 is to provide the bias for the generation of iMir2 at iRead node 823. iMir2 generation circuitry 834 is, in the shown example embodiment, a copy or replica of iRead generation circuitry 830, sharing the same bias therewith. iMir1 enable circuitry 902 is connected to a Vss or ground 916, and the iRead generation circuitry 830 and iMir2 generation circuitry are both connected to a negative rail 914 as shown.

FIG. 9 shows one possible implementation of the memory circuitry of FIG. 8. In this implementation, iMir1 is generated using a PMOS mirror or iMir1 bias circuitry 904 and PMOS enable circuitry 902. IMir1 enable circuitry 902 controls enablement of the mirror, and Imir1 bias voltage at the mirror is supplied from a bias voltage generator. The iMir 1 amplitude can be controlled by the bias voltage generator circuitry which is not shown. Imir2 is generated using a replica of iRead mirror. An advantage of FIG. 9 is that the iRead mirror and iMir2 share a same bias voltage. iMir2 may be controlled by a different enable signal than that used for iRead. In normal operation, 'imir1 enable' and 'imir2 enable' are triggered at the same time to enable and disable both mirrors.

Referring next to FIG. 10, MOSFET circuitry 828 is shown including the WL PMOS 804, terminals 820 (source) and 822 (drain), corresponding to WL node 821 and iRead node 823 respectively, iRead generation circuitry 830, iMir1 current generation circuitry 832, and iMir2 current generation circuitry 834. In the shown embodiment of FIG. 10, iMir1 current generation circuitry 832 is biased using the iRead bias generation circuitry 1005 by way of its coupling to the same through node 1004. The sharing of the bias with the iRead generation circuitry 834, in the shown example of FIG. 10, includes two pairs of MOSFET transistors, in the form of four PMOS transistors, with their gates interconnected and further connected to the iRead bias 1005 by way of node 1004, for example in a Cascode arrangement. iMir1 current generation circuitry 832 in the embodiment of FIG. 10 also includes an iMir1 enable circuitry 1002 which includes a transistor, such as PMOS transistor. iMir1 enable circuitry 1002, similar to iMir enable circuitry 902 of FIG. 9, is to enable and disable iMir1, and iRead bias circuitry 1005 is to provide the bias for the generation of iMir1 at WL node 821. In the shown embodiment, iRead generation circuitry 830 includes an iRead bias circuitry 1005, including a NMOS transistors 1005A, and an iRead enable circuitry 1008, including, in the shown embodiment, a NMOS transistor 1009A. In the shown embodiment of FIG. 10, iMir2 current generation circuitry 834 is a double copy or replica of the iRead generation circuitry 830, such that a sum of the currents flowing through each of the copies corresponds to iMir2 flowing in the iRead node 823. IMir2 current generation circuitry 834 is coupled to the iRead bias circuitry 1005 in such a way that the iRead bias circuitry provides the bias to the iMir2 current generation circuitry 834. In the shown embodiment, iRead bias circuitry supplies the bias to iMir2 generation circuitry 834 by way of NMOS' 1005B and 1005C connected to NMOS 1005A of iRead generation circuitry 830. iMir2 generation circuitry further includes iMir2 enable circuitry 1012 which in the shown example of FIG. 10 includes two transistors, such as an NMOS transistors 1009B and 1009C. iMir2 enable circuitry 1002 is to enable and disable iMir2, and iRead bias circuitry 1005 is to provide the bias for the generation of iMir2 at iRead node 823. iMir2 generation circuitry 834 includes, in the shown example embodiment, two copies of iRead generation circuitry 830, sharing the same bias therewith. iMir1 enable circuitry 1002 is connected to a Vss or ground 1016, and the iRead generation circuitry 830 and iMir2 generation circuitry are both connected to a negative rail 1014 as shown.

The embodiments of FIGS. 9 and 10 show the iMir2 generation circuits as corresponding to copies of the iRead generation circuitry. The current ratios for currents running through the iRead line 1001 and through iMir2 line 1003 could be 1:1, meaning that the currents running through both lines 1001 and 1003 would be substantially identical. With the same bias applied at iRead bias 1005, the current ratio could be 1:X, where X could be equal to, less than or higher than 1. Current value of iMir2 and iMir1 can be controlled in many ways, for example by controlling the mirror aspect ratio (width/length of the MOSFEET), and/or adding extra devices and switches to be programmable via registers or fuses etc.

Although the embodiments above describe the provision of first and/or second current generation circuitries at one WL node of a memory cell, it is to be understood that such current generation circuitries may be replicated according to embodiments to generate a first mirror current and/or a second mirror current at respective WL nodes of memory cells of memory arrays of a memory circuitry. Embodiments encompass providing first and/or second current generation circuitries at each respective WL of a memory array, or to provide first and/or second current generation circuitries to be shared between a set of WLs of a memory array.

Although embodiments described above relate to the provision of iMir1 and/or iMir 2 at the WL side of a memory circuitry as shown in FIGS. 8-10 where current mode sensing is implemented at the BL side of the memory circuitry, it is to be understood that embodiments encompass the provision of iMir 1 and/or iMir2 at the BL side of a memory circuitry where current mode sensing is implemented at the WL side of the memory circuitry. Essentially, iMir1 and/or iMir2 are to be provided at one of the WL or BL nodes where sensing is provided at the opposite note, BL or WL. Thus, in either case, the concept in FIGS. 8-10 is to apply the "bleeder" circuitry (the mirror current generation circuitry) on the side of the memory cell opposite the side to which the sensing circuitry is connected.

Figure 11:
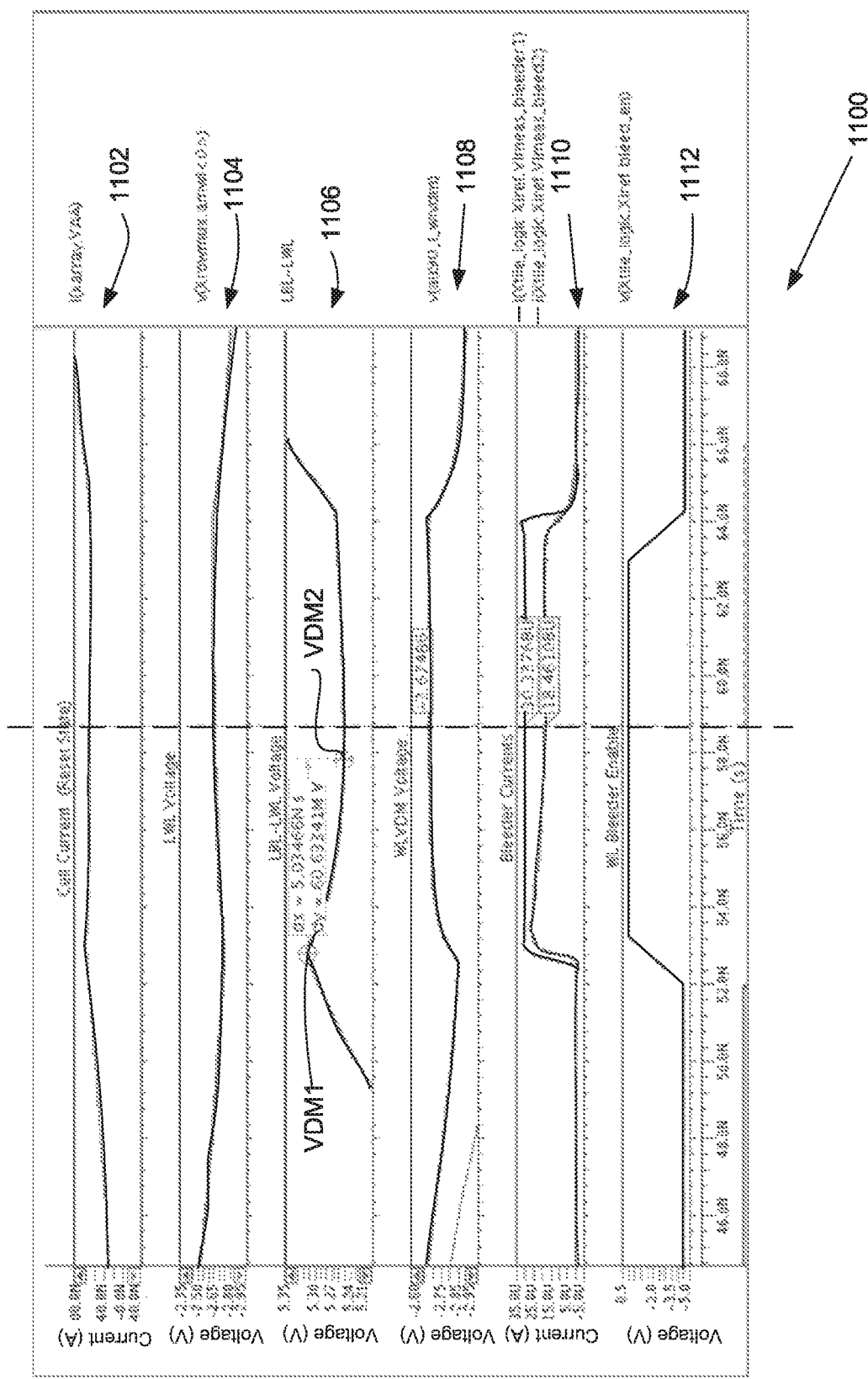
FIG. 11 is a graph showing plots of voltages and currents for a simulation involving a phase change memory cell (SXP cell) controller by circuitry similar to that shown in FIG. 9.

FIG. 11 shows simulation response plots 1100 across a selected SXP cell that is based on FIG. 8 with the implementation shown in FIG. 9 of an 3D cross point cell in the reset state for a read operation to show how the iMir1 (labeled as bleeder1) and iMir2 (labeled as bleeder 2) function. Referring to FIG. 11, the top plot 1102 shows the current flow icell through the selected SXP cell. Given that this SXP cell of FIG. 11 is in a reset state, the current icell is close to zero, and consists only of leakage current. The second plot1104 shows the local word line voltage (amwl<0>), that is, the voltage corresponding to LWL node at FIG. 8. The third plot 1106 interestingly shows the local bit line (LBL) voltage, that is, the voltage of BL node 819 LBL node at FIG. 8, minus the local word line voltage (LWL), equaling the voltage across the selected cell corresponding to VDM. Plot 1106 corresponds to the plot 6004 at FIG. 6, where voltage is reduced (intended behavior) when current iMir1 and iMir2 are applied. Plot 1106 shows VDM as decreasing and reaching a steady-state voltage level where sensing would be enabled. The sensing circuitry implemented on the bit line side as shown in FIG. 8 (sense amp) would be enabled where the red dotted line is. Plot 1108 shows the voltage at WL node 821, that is, wlvdm as increasing after application of the bleeder current iMir1, and achieving a steady state. Plot 1110 shows the bleeder currents or iMir1 and iMir2 as being enabled, and the corresponding currents from these mirrors. Plot 1112 shows the WL enable circuitry 902 and 1102 of FIGS. 9 and 10 as enabling iMir1. A line 1114 through plots 1102-1112 shows a time when sensing occurs at a current sense amplifier such as sense amplifier 806. Although a delay is suggested with respect to sensing in plots 1102-1112, this delay is an artifact of the simulation used to generate the plots, but does not reflect how early sensing may be enabled in methods according to embodiments.

The simulation corresponding to the plots of FIG. 11 shows that the sensing occurs when the voltages are stabilized so that a maximum margin can be achieved for sensing or reading the state of the SXP cell while achieving the response outlined in FIG. 6 at 606. In this example simulation, the iMir1 (Vimeas_bleeder1) of 30 uA is greater than the value of iMirr2 (Vimeas_bleed2) of 18.46 uA so that the voltage across the SXP cell (plot 1106, LBL-LWL) would decrease by 60 mV within a time period of 5 nano-seconds. This relationship meets the particular timing example as implemented in a real SXP product. However, this particular implementation results in approx. 2 micro-amps (uA) of current loss to the selected SXP cell from its ideal intended value when the SXP cell is in a set state (e.g. the memory cell current would be =iRead-2 uAn instead of iRead where iRead is much higher than 2 uA). Although this is an undesirable effect, it does not "break" the functionality in any way nor does it affect the desired response as outlined in this idea, illustrated in FIG. 6.

Figure 12:
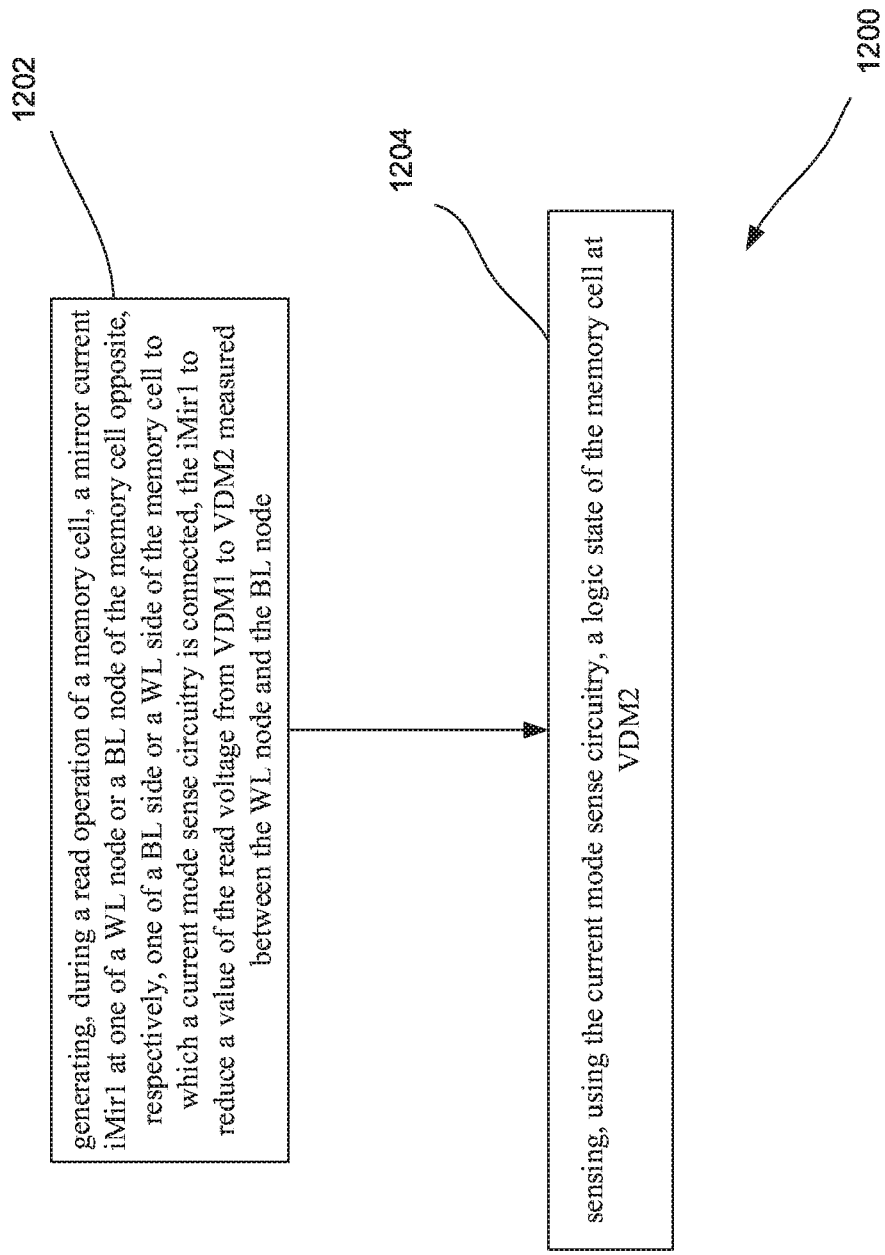
FIG. 12 illustrates an example process for logging commands and associated addresses for a memory debug operation in accordance with certain embodiments.

FIG. 12 illustrates an example of a process 1200 according to some embodiments. The process includes, at operation 1202, generating, during a read operation of a memory cell, a mirror current iMir1 at one of a WL node or a BL node of the memory cell opposite, respectively, one of a BL side or a WL side of the memory cell to which a current mode sense circuitry is connected, the iMir1 to reduce a value of the read voltage from VDM1 to VDM2 measured between the WL node and the BL node; at operation 1204, the process includes sensing, using the current mode sense circuitry, a logic state of the memory cell at VDM2.

The flow described in FIG. 6 is merely representative of operations that may occur in particular embodiments. In other embodiments, additional operations may be performed by the components of system 100. Various embodiments of the present disclosure contemplate any suitable signaling mechanisms for accomplishing the functions described herein. Some of the operations illustrated in FIG. 6 may be repeated, combined, modified, or deleted where appropriate. Additionally, operations may be performed in any suitable order without departing from the scope of particular embodiments.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or retransmission of the electrical signal is performed, a new copy is made. Thus, a communication provider or a network provider may store on a tangible, machine-readable storage medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the functionality of the various components such as CPU 102, external I/O controller 104, processor 108, cores 114A and 114B, I/O controller 110, CPU memory controller 112, storage device 106, system memory device 107, memory chip 116, storage device controller 118, address translation engine 120, memory partition 122, program control logic 124, chip controller 126, memory array 306, memory partition controller 310, word line control logic 314, bit line control logic 316, or other entity or component described herein, or subcomponents of any of these. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing, and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1 's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware, or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage medium used in the transmission of information over the Internet via electrical, optical, acoustical or other forms of propagated signals (e.g., carrier waves, infrared signals, digital signals, etc.). Accordingly, the computer-readable medium includes any type of tangible machine-readable storage medium suitable for storing or transmitting electronic instructions or information in a form readable by a machine (e.g., a computer).

Some examples of embodiments are provided below.

Example 1 includes a device comprising a memory controller configured to reduce a read voltage of a target memory cell from a first read voltage VDM1 to a second read voltage VDM2 during a read operation of the target memory cell, the read voltage between a bitline (BL) node and a wordline (WL) node of the memory cell, the memory controller comprising: a mirror current generation circuitry to be coupled to one of the WL node or the BL node of the memory cell opposite, respectively, one of a BL side or a WL side of the memory cell to which a current mode sense circuitry is to be connected; and a switch circuit including logic to control the mirror current generation circuitry to generate a mirror current iMir1 at said one of the WL node or the BL node during the read operation to reduce a value of the read voltage from VDM1 to VDM2, the current mode sense circuitry to sense a logic state of the memory cell at VDM2.

Example 2 includes the subject matter of Example 1, and optionally, further including a read current (iRead) generation circuitry to be coupled the memory cell to generate a current iRead at a WL side or a BL side of the memory cell to which the mirror current generation circuitry is to be connected, wherein current icell through the memory cell is based on iRead.

Example 3 includes the subject matter of Example 2, and optionally, wherein the mirror current generation circuitry is a first mirror current generation circuitry, the device further comprising a second mirror current generation circuitry to be coupled to the memory cell to generate a second mirror current iMir2 at the WL side or BL side of the memory cell to which the mirror current generation circuitry is to be connected such that icell+iMir1=iRead+iMir2, wherein iMir2≥iMir1.

Example 4 includes the subject matter of Example 3, and optionally, wherein the iRead generation circuitry includes an iRead bias circuitry, and the second mirror current generation circuitry includes one or more replicas of the iRead generation circuitry and an iMir2 bias circuitry that shares a same bias as the iRead bias circuitry.

Example 5 includes the subject matter of Example 3, and optionally, wherein the iRead generation circuitry includes an iRead enable circuitry to enable generation of iRead, and the second mirror current generation circuitry includes one or more iMir2 enable circuitries distinct from the iRead enable circuitry to enable generation of iMir2.

Example 6 includes the subject matter of Example 3, and optionally, wherein the iRead generation circuitry includes an iRead bias circuitry, and the first mirror current generation circuitry includes an iMir1 enable circuitry to enable generation of iMir1, and an iMir1 bias circuitry distinct from the iRead bias circuitry.

Example 7 includes the subject matter of Example 3, and optionally, wherein the iRead generation circuitry includes an iRead bias circuitry, and the first mirror current generation circuitry includes an iMir1 enable circuitry to enable generation of iMir1 and an iMir1 bias circuitry that corresponds to the iRead bias circuitry.

Example 8 includes the subject matter of Example 7, and optionally, wherein the first mirror current generation circuitry includes pairs of positive metal oxide semiconductor field effect transistors (MOSFETs) including respective gates connected to the iRead bias circuitry.

Example 9 includes the subject matter of Example 8, and optionally, wherein the second mirror current generation circuitry includes one or more replicas of the iRead generation circuitry and an iMir2 bias circuitry that corresponds to the iRead bias circuitry.

Example 10 includes the subject matter of Example 1, and optionally, wherein a current ratio as between iRead and iMir2 is 1:X, and wherein the switch circuitry is to determine X is based on iMir1.

Example 11 includes the subject matter of Example 10, and optionally, wherein the switch circuit corresponds to a WL switch circuit if the mirror current generation circuitry is to be connected to the WL node, and to a BL switch circuit if the mirror current generation circuitry is to be connected to the BL node.

Example 12 includes a system comprising: a memory array including a plurality of memory cells, bitlines and wordlines, a memory cell of the memory cells coupled between a bitline (BL) node of a corresponding BL and a wordline (WL) node of a corresponding WL; a mirror current generation circuitry coupled to one of the WL node or the BL node of the memory cell opposite one of a BL side or a WL side of the memory cell to which a current mode sense circuitry is to be connected to sense a logic state of the memory cell during a read operation; and a controller including logic to control the mirror current generation circuitry to generate a mirror current iMir1 at said one of the WL node or the BL node during the read operation to reduce a value of a read voltage between the BL node and the WL node from a first read voltage VDM1 to a second read voltage VDM2, the current mode sense circuitry to sense a logic state of the memory cell at VDM2.

Example 13 includes the subject matter of Example 12, and optionally, further including a read current (iRead) generation circuitry coupled the memory cell to generate a current iRead at a WL side or a BL side of the memory cell to which the mirror current generation circuitry is connected, wherein current icell through the memory cell is based on iRead.

Example 14 includes the subject matter of Example 13, and optionally, wherein the mirror current generation circuitry is a first mirror current generation circuitry, the system further comprising a second mirror current generation circuitry coupled to the memory cell to generate a second mirror current iMir2 at the WL side or BL side of the memory cell to which the mirror current generation circuitry is connected such that icell+iMir1=iRead+iMir2, wherein iMir2≥iMir1.

Example 15 includes the subject matter of Example 14, and optionally, wherein the iRead generation circuitry includes an iRead bias circuitry, and the second mirror current generation circuitry includes one or more replicas of the iRead generation circuitry and an iMir2 bias circuitry that shares a same bias with the iRead bias circuitry.

Example 16 includes the subject matter of Example 14, and optionally, wherein the iRead generation circuitry includes an iRead enable circuitry to enable generation of iRead, and the second mirror current generation circuitry includes one or more iMir2 enable circuitries distinct from the iRead enable circuitry to enable generation of iMir2.

Example 17 includes the subject matter of Example 13, and optionally, wherein the iRead generation circuitry includes an iRead bias circuitry, and the mirror current generation circuitry includes an iMir1 enable circuitry to enable generation of iMir1, and an iMir1 bias circuitry distinct from the iRead bias circuitry.

Example 18 includes the subject matter of Example 14, and optionally, wherein the iRead generation circuitry includes an iRead bias circuitry, and the mirror current generation circuitry includes an iMir1 enable circuitry to enable generation of iMir1 and an iMir1 bias circuitry that corresponds to the iRead bias circuitry.

Example 19 includes the subject matter of Example 15, and optionally, wherein the first mirror current generation circuitry includes pairs of positive metal oxide semiconductor field effect transistors (MOSFETs) including respective gates connected to iRead bias circuitry.

Example 20 includes the subject matter of Example 19, and optionally, wherein the second mirror current generation circuitry includes one or more replicas of the iRead generation circuitry and an iMir2 bias circuitry that corresponds to the iRead bias circuitry.

Example 21 includes the subject matter of Example 13, and optionally, wherein a current ratio as between iRead and iMir2 is 1:X, and wherein the controller is to determine X is based on iMir1.

Example 22 includes the subject matter of Example 12, and optionally, further including the current mode sense circuitry.

Example 23 includes the subject matter of Example 12, and optionally, wherein the controller corresponds to a WL switch circuit if the mirror current generation circuitry connected to the WL node, and corresponds to a BL switch circuit if a mirror current generation circuitry is connected to the BL node.

Example 24 includes a method comprising: generating, during a read operation of a memory cell, a mirror current iMir1 at one of a WL node or a BL node of the memory cell opposite, respectively, one of a BL side or a WL side of the memory cell to which a current mode sense circuitry is connected, the iMir1 to reduce a value of the read voltage from VDM1 to VDM2, wherein the read voltage is between the WL node and the BL node; and sensing, using the current mode sense circuitry, a logic state of the memory cell at VDM2.

Example 25 includes the subject matter of Example 24, and optionally, further including generating a current iRead at a WL side or a BL side of the memory cell at which the mirror current is generated, wherein current icell through the memory cell is based on iRead.

Example 26 includes the subject matter of Example 25, and optionally, wherein the mirror current is a first mirror current, the method further comprising generating a second mirror current iMir2 at the WL side or BL side of the memory cell at which the first mirror current is generated such that icell+iMir1=iRead+iMir2, wherein iMir2≥iMir1.

Example 27 includes the subject matter of Example 26, and optionally, further including providing an iRead bias to generate both iRead and iMir2.

Example 28 includes the subject matter of Example 27, and optionally, further including providing an iRead enable signal to enable generation of iRead, and one or more iMir2 enable signals distinct from the iRead enable signal to enable generation of iMir2.

Example 29 includes the subject matter of Example 27, and optionally, further including providing an iRead enable signal to enable generation of iRead, an iMir1 bias distinct from the iRead bias to generate iMir1, and an iMir1 enable signal distinct from the iRead enable signal to enable generation of iMir1.

Example 30 includes the subject matter of Example 27, and optionally, further including providing an iRead enable signal to enable generation of iRead, an iRead bias to generate iRead, iMir1 and iMir2, and an iMir1 enable signal distinct from the iRead enable signal to enable generation of iMir1.

Example 31 includes the subject matter of Example 30, and optionally, wherein providing the iRead bias to generate the first mirror current includes providing pairs of positive metal oxide semiconductor field effect transistors (MOSFETs) including interconnected respective gates.

Example 32 includes the subject matter of Example 24, and optionally, wherein a current ratio as between iRead and iMir2 is 1:X, the method further including determining X based on iMir1.

Example 33 includes a non-transitory machine readable storage medium having instructions stored thereon, the instructions when executed by a machine to cause the machine to: reduce a read voltage of a target memory cell from a first read voltage VDM1 to a second read voltage VDM2 during a read operation of the target memory cell, the read voltage between a bitline (BL) node and a wordline (WL) node of the memory cell; generate, during a read operation of the memory cell, a mirror current iMir1 at one of the WL node or the BL node of the memory cell opposite, respectively, one of a BL side or a WL side of the memory cell to which a current mode sense circuitry is connected, the iMir1 to reduce a value of the read voltage from VDM1 to VDM2; and sense, using the current mode sense circuitry, a logic state of the memory cell at VDM2.

Example 34 includes the subject matter of Example 33, and optionally, the instructions further to cause the machine to generate a current iRead at a WL side or a BL side of the memory cell at which the mirror current is generated, wherein current icell through the memory cell is based on iRead.

Example 35 includes the subject matter of Example 34, and optionally, wherein the mirror current is a first mirror current, the instructions further to cause the machine to generate a second mirror current iMir2 at the WL side or BL side of the memory cell at which the first mirror current is generated such that icell+iMir1=iRead+iMir2, wherein iMir2≥iMir1.

Example 36 includes the subject matter of Example 35, and optionally, the instructions further to cause the machine to provide an iRead bias to generate both iRead and iMir2.

Example 37 includes the subject matter of Example 36, and optionally, the instructions further to cause the machine to provide an iRead enable signal to enable generation of iRead, and one or more iMir2 enable signals distinct from the iRead enable signal to enable generation of iMir2.

Example 38 includes the subject matter of Example 36, and optionally, the instructions further to cause the machine to provide an iRead enable signal to enable generation of iRead, an iMir1 bias distinct from the iRead bias to generate iMir1, and an iMir1 enable signal distinct from the iRead enable signal to enable generation of iMir1.

Example 39 includes the subject matter of Example 36, and optionally, the instructions further to cause the machine to provide an iRead enable signal to enable generation of iRead, an iRead bias to generate iRead, iMir1 and iMir2, and an iMir1 enable signal distinct from the iRead enable signal to enable generation of iMir1.

Example 40 includes the subject matter of Example 39, and optionally, wherein providing the iRead bias to generate the first mirror current includes sending control signals to control pairs of positive metal oxide semiconductor field effect transistors (MOSFETs) including interconnected respective gates.

Example 41 includes the subject matter of Example 33, and optionally, wherein a current ratio as between iRead and iMir2 is 1:X, the instructions further to cause the machine to determine X based on iMir1.

Example 42 includes a non-transitory machine readable storage medium having instructions stored thereon, the instructions when executed by a machine to cause the machine to:

Example 43 includes an device comprising: one or more processors and one or more computer-readable media comprising instructions that, when executed by the one or more processors, cause the one or more processors to perform the method, techniques, or process as described in or related to any of the Examples above, or portions thereof.

Example 44 includes a signal as described in or related to any of the Examples above, or portions or parts thereof.

Example 45 includes a datagram, packet, frame, segment, protocol data unit (PDU), or message as described in or related to any of the Examples above, or portions or parts thereof, or otherwise described in the present disclosure.

Example 46 includes a signal encoded with data as described in or related to any of the Examples above, or portions or parts thereof, or otherwise described in the present disclosure.

Example 47 includes a signal encoded with a datagram, packet, frame, segment, protocol data unit (PDU), or message as described in or related to any of the Examples above, or portions or parts thereof, or otherwise described in the present disclosure.

Example 48 includes an electromagnetic signal carrying computer-readable instructions, wherein execution of the computer-readable instructions by one or more processors is to cause the one or more processors to perform the method, techniques, or process as described in or related to any of the Examples above, or portions thereof.

Example 49 includes a computer program comprising instructions, wherein execution of the program by a processing element is to cause the processing element to carry out the method, techniques, or process as described in or related to any of the Examples above, or portions thereof.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising a memory controller configured to reduce a read voltage of a target memory cell from a first read voltage VDM1 to a second read voltage VDM2 during a read operation of the target memory cell, the read voltage between a bitline (BL) node and a wordline (WL) node of the memory cell, the memory controller comprising:
   a mirror current generation circuitry to be coupled to one of the WL node or the BL node of the memory cell opposite, respectively, one of a BL side or a WL side of the memory cell to which a current mode sense circuitry is to be connected; and
   a switch circuit including logic to control the mirror current generation circuitry to generate a mirror current iMir1 at said one of the WL node or the BL node during the read operation to reduce a value of the read voltage from VDM1 to VDM2, the current mode sense circuitry to sense a logic state of the memory cell at VDM2.

2. The apparatus of claim 1, further including a read current (iRead) generation circuitry to be coupled the memory cell to generate a current iRead at a WL side or a BL side of the memory cell to which the mirror current generation circuitry is to be connected, wherein current icell through the memory cell is based on iRead.

3. The apparatus of claim 2, wherein the mirror current generation circuitry is a first mirror current generation circuitry, the apparatus further comprising a second mirror current generation circuitry to be coupled to the memory cell to generate a second mirror current iMir2 at the WL side or BL side of the memory cell to which the mirror current generation circuitry is to be connected such that icell+iMir1=iRead+iMir2, wherein iMir2≥iMir1.

4. The apparatus of claim 3, wherein the iRead generation circuitry includes an iRead bias circuitry, and the second mirror current generation circuitry includes one or more replicas of the iRead generation circuitry and an iMir2 bias circuitry that shares a same bias as the iRead bias circuitry.

5. The apparatus of claim 3, wherein the iRead generation circuitry includes an iRead enable circuitry to enable generation of iRead, and the second mirror current generation circuitry includes one or more iMir2 enable circuitries distinct from the iRead enable circuitry to enable generation of iMir2.

6. The apparatus of claim 3, wherein the iRead generation circuitry includes an iRead bias circuitry, and the first mirror current generation circuitry includes an iMir1 enable circuitry to enable generation of iMir1, and an iMir1 bias circuitry distinct from the iRead bias circuitry.

7. The apparatus of claim 3, wherein the iRead generation circuitry includes an iRead bias circuitry, and the first mirror current generation circuitry includes an iMir1 enable circuitry to enable generation of iMir1 and an iMir1 bias circuitry that corresponds to the iRead bias circuitry.

8. The apparatus of claim 7, wherein the first mirror current generation circuitry includes pairs of positive metal oxide semiconductor field effect transistors (MOSFETs) including respective gates connected to the iRead bias circuitry.

9. The apparatus of claim 8, wherein the second mirror current generation circuitry includes one or more replicas of the iRead generation circuitry and an iMir2 bias circuitry that corresponds to the iRead bias circuitry.

10. The apparatus of claim 1, wherein a current ratio as between iRead and iMir2 is 1:X, and wherein the switch circuitry is to determine X is based on iMir1.

11. The apparatus of claim 10, wherein the switch circuit corresponds to a WL switch circuit if the mirror current generation circuitry is to be connected to the WL node, and to a BL switch circuit if the mirror current generation circuitry is to be connected to the BL node.

12. A system comprising:
a memory array including a plurality of memory cells, bitlines and wordlines, a memory cell of the memory cells coupled between a bitline (BL) node of a corresponding BL and a wordline (WL) node of a corresponding WL;
a mirror current generation circuitry coupled to one of the WL node or the BL node of the memory cell opposite one of a BL side or a WL side of the memory cell to which a current mode sense circuitry is to be connected to sense a logic state of the memory cell during a read operation; and
a controller including logic to control the mirror current generation circuitry to generate a mirror current iMir1 at said one of the WL node or the BL node during the read operation to reduce a value of a read voltage between the BL node and the WL node from a first read voltage VDM1 to a second read voltage VDM2, the current mode sense circuitry to sense a logic state of the memory cell at VDM2.

13. The system of claim 12, further including a read current (iRead) generation circuitry coupled the memory cell to generate a current iRead at a WL side or a BL side of the memory cell to which the mirror current generation circuitry is connected, wherein current icell through the memory cell is based on iRead.

14. The system of claim 13, wherein the mirror current generation circuitry is a first mirror current generation circuitry, the system further comprising a second mirror current generation circuitry coupled to the memory cell to generate a second mirror current iMir2 at the WL side or BL side of the memory cell to which the mirror current generation circuitry is connected such that icell+iMir1=iRead+iMir2, wherein iMir2≥iMir1.

15. A method comprising:
generating, during a read operation of a memory cell, a mirror current iMir1 at one of a WL node or a BL node of the memory cell opposite, respectively, one of a BL side or a WL side of the memory cell to which a current mode sense circuitry is connected, the iMir1 to reduce a value of the read voltage from VDM1 to VDM2, wherein the read voltage is between the WL node and the BL node; and
sensing, using the current mode sense circuitry, a logic state of the memory cell at VDM2.

16. The method of claim 15, further including generating a current iRead at a WL side or a BL side of the memory cell at which the mirror current is generated, wherein current icell through the memory cell is based on iRead.

17. The method of claim 16, wherein the mirror current is a first mirror current, the method further comprising generating a second mirror current iMir2 at the WL side or BL side of the memory cell at which the first mirror current is generated such that icell+iMir1=iRead+iMir2, wherein iMir2≥iMir1.

18. A non-transitory machine readable storage medium having instructions stored thereon, the instructions when executed by a machine to cause the machine to:
reduce a read voltage of a target memory cell from a first read voltage VDM1 to a second read voltage VDM2 during a read operation of the target memory cell, the read voltage between a bitline (BL) node and a wordline (WL) node of the memory cell;
generate, during a read operation of the memory cell, a mirror current iMir1 at one of the WL node or the BL node of the memory cell opposite, respectively, one of a BL side or a WL side of the memory cell to which a current mode sense circuitry is connected, the iMir1 to reduce a value of the read voltage from VDM1 to VDM2; and
sense, using the current mode sense circuitry, a logic state of the memory cell at VDM2.

19. The machine readable storage medium of claim 18, the instructions further to cause the machine to generate a current iRead at a WL side or a BL side of the memory cell at which the mirror current is generated, wherein current icell through the memory cell is based on iRead.

20. The machine readable storage medium of claim 19, wherein the mirror current is a first mirror current, the instructions further to cause the machine to generate a second mirror current iMir2 at the WL side or BL side of the memory cell at which the first mirror current is generated such that icell+iMir1=iRead+iMir2, wherein iMir2≥iMir1.

* * * * *